(12) United States Patent
Zhang et al.

(10) Patent No.: US 8,222,130 B2
(45) Date of Patent: Jul. 17, 2012

(54) HIGH VOLTAGE DEVICE

(75) Inventors: Guowei Zhang, Singapore (SG);
Purakh Raj Verma, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 496 days.

(21) Appl. No.: 12/500,620

(22) Filed: Jul. 10, 2009

(65) Prior Publication Data

US 2010/0213543 A1   Aug. 26, 2010

Related U.S. Application Data

(63) Continuation-in-part of application No. 12/390,509, filed on Feb. 23, 2009, now Pat. No. 8,053,319.

(51) Int. Cl.
*H01L 21/22* (2006.01)
(52) U.S. Cl. .................. 438/551; 257/E21.434
(58) Field of Classification Search .................. 438/551, 438/671, 942; 257/E21.035, E21.058, E21.434, 257/E21.63
See application file for complete search history.

(56) References Cited

U.S. PATENT DOCUMENTS 7,776,700 B2 *   8/2010   Yang et al. .................. 438/286

OTHER PUBLICATIONS

Leonard Rubin et al., Narrow $n^+/p^+$ isolation in retrograde well implants, Solid State Technology Magazine, Jul. 1, 2003, pp. 119-125, vol. 46 Issue 7, Solid State Technology, USA.

* cited by examiner

*Primary Examiner* — Quoc Hoang
(74) *Attorney, Agent, or Firm* — Horizon IP Pte Ltd

(57) ABSTRACT

A method of forming a device is presented. The method includes providing a substrate prepared with an active device region. The active device region includes gate stack layers of a gate stack including at least a gate electrode layer over a gate dielectric layer. A first mask is provided on the substrate corresponding to the gate. The substrate is patterned to at least remove portions of a top gate stack layer unprotected by the first mask. A second mask is also provided on the substrate with an opening exposing a portion of the first mask and the top gate stack layer. A channel well is formed by implanting ions through the opening and gate stack layers into the substrate.

18 Claims, 29 Drawing Sheets

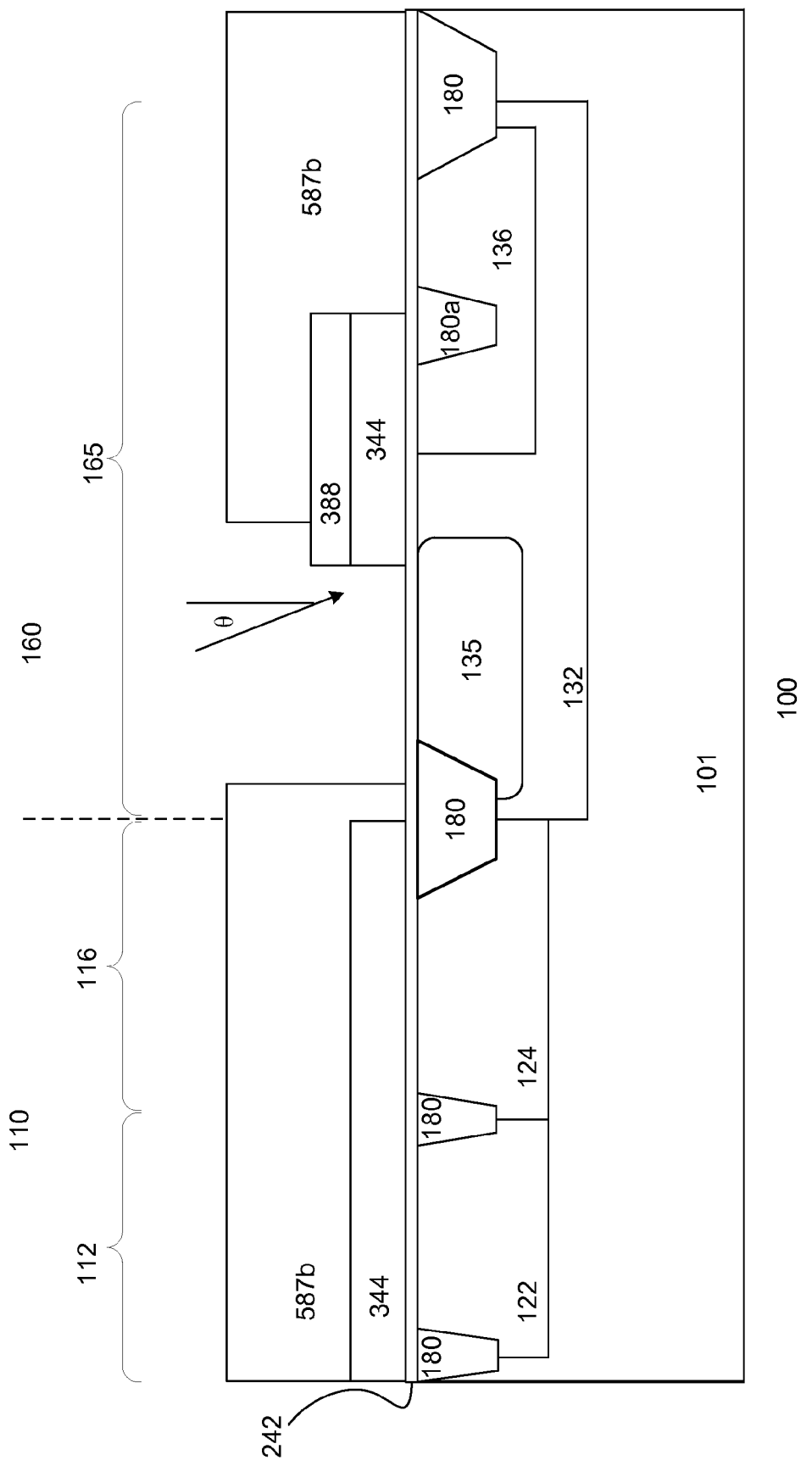

HIGH VOLTAGE DEVICE

CROSS-REFERENCE TO RELATED APPLICATION

This application is a continuation-in-part application which claims benefit of co-pending U.S. patent application Ser. No. 12/390,509, filed on Feb. 23, 2009. All disclosures are incorporated herewith by reference.

BACKGROUND

Lateral Double-Diffused (LD) transistors have been widely employed in high voltage applications. For high performance LD transistors, low drain-to-source on-resistance ($Rds_{on}$) is desired to minimize its power dissipation when it is turned on, as well as high breakdown voltage to maximize its voltage capability. To achieve low $Rds_{on}$, the channel of the high LD transistor should be as short as possible.

As technology evolves into era of deep sub-micron (e.g., beyond 0.35 µm) Very-Large-Scale Integration (VLSI), there is a desire for both high voltage (HV) LD transistors and low voltage (LV) transistors to be fabricated on the same substrate. Generally, the processes for forming LV devices, such as complementary metal-oxide-semiconductor (CMOS) processes, are used to form the HV devices. However, conventional CMOS processes are incompatible for forming HV transistors. For example, process overlay issues make it difficult for alignment of the HV channel well, which defines the channel length. Process variations in process overlay requires large process windows. This makes forming short channel lengths to achieve low $RDs_{on}$ difficult if not impossible. Furthermore, the thin gate electrodes used prevent them serving as a hard mask, further exacerbating process control in forming the channel well.

From the foregoing discussion, it is desirable to provide reliable HV devices formed with short channel lengths to have low $Rds_{on}$.

SUMMARY

A method of forming a device is presented. The method includes providing a substrate prepared with an active device region. The active device region includes gate stack layers of a gate stack including at least a gate electrode layer over a gate dielectric layer. A first mask is provided on the substrate corresponding to the gate. The substrate is patterned to at least remove portions of a top gate stack layer unprotected by the first mask. A second mask is also provided on the substrate with an opening exposing a portion of the first mask and the top gate stack layer. A channel well is formed by implanting ions through the opening and gate stack layers into the substrate.

In another embodiment, another method of forming a device is disclosed. The method includes proving a substrate prepared with an active device region. The active device region includes a doped drift well in a first portion of the active device region and gate stack layers of a gate stack. The gate stack layers include at least a gate electrode layer over a gate dielectric layer on the surface of the substrate. A first mask is provided on the substrate corresponding to the gate. The substrate is patterned to at least remove portions of a top gate stack layer unprotected by the first mask. A second mask is also provided on the substrate with an opening exposing a portion of the first mask and the top gate stack layer. A channel well is formed by implanting ions through the opening and gate stack layers into the substrate.

In yet another embodiment, a device is presented. The device includes a substrate prepared with an active device region. The active device region includes a gate stack with a gate electrode layer over a gate dielectric layer. At least the gate electrode layer is patterned using a hard mask. The device also includes a doped channel well disposed in the substrate adjacent to the first edge of the gate. The first edge of the gate overlaps the channel well with a channel edge of the channel well beneath the gate. The first edge of the gate and channel edge define an effective channel length of the device. A doped drift well adjacent to the second edge of the gate is also included.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 5a-g show another embodiment of a process for forming a device.

DETAILED DESCRIPTION

Embodiments generally relate to semiconductor devices or integrated circuits. More particularly, some embodiments relate to high power devices. For example, high power devices include lateral double-diffused (LD) transistors, such as metal oxide transistors (MOS). The high power devices can be employed as switching voltage regulators for power management applications. The LD transistors can be easily integrated into devices or ICs. The devices or ICs can be incorporated into or used with, for example, consumer electronic products, particularly portable consumer products, such as cell phones, laptop computers and personal digital assistants (PDAs).

Figure 1:
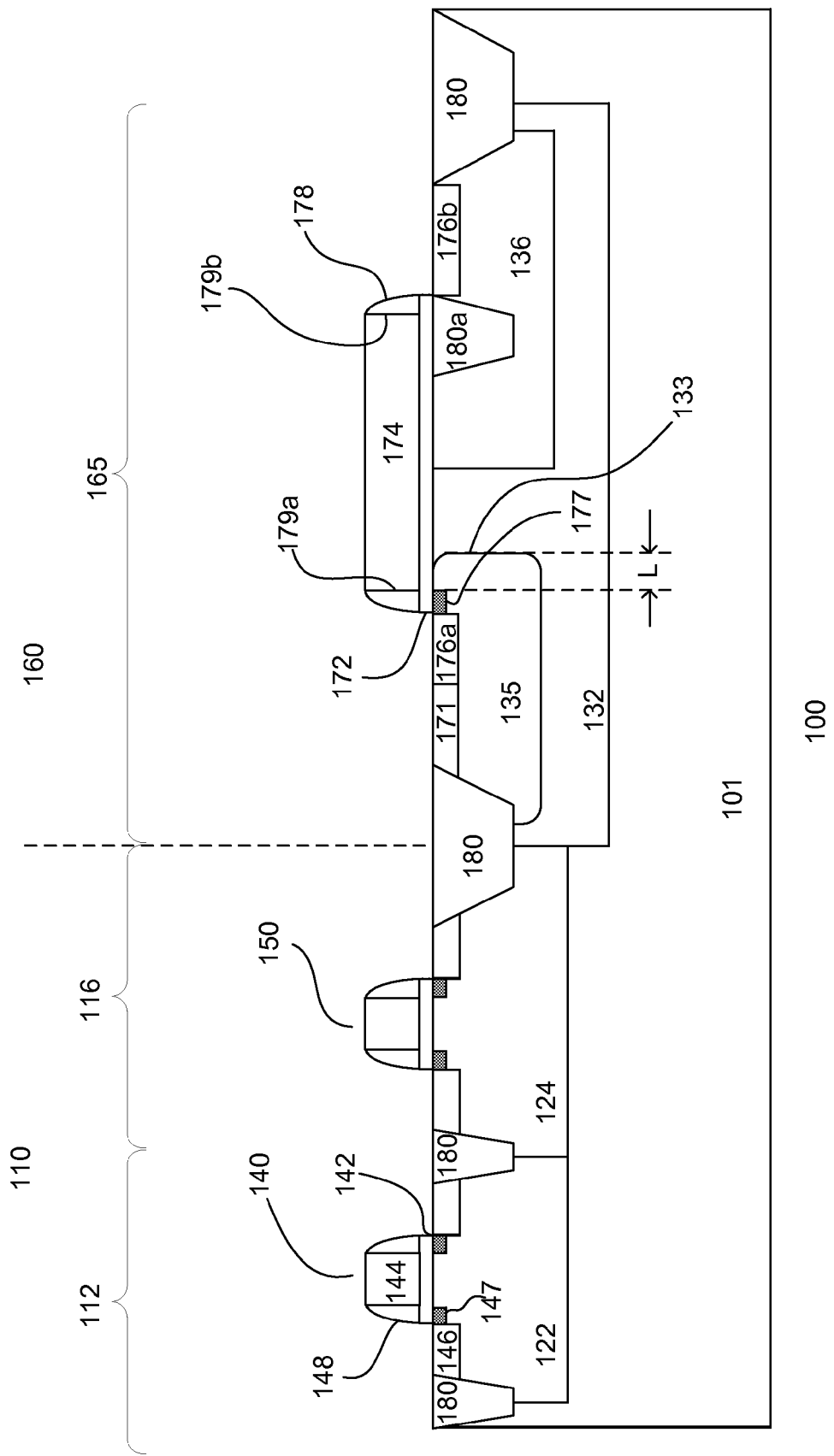
FIG. 1 shows an embodiment of a device.

FIG. 1 shows a portion 100 of an embodiment of a device. As shown, the portion includes a substrate 101. The substrate, for example, comprises a silicon substrate. The substrate can be lightly doped with p-type dopants. N-type or other types of substrates, such as silicon germanium or silicon-on-insulator (SOI), are also useful.

The substrate may be prepared with first and second regions 110 and 160. In one embodiment, the first region comprises a low voltage (LV) device region while the second region comprises a high voltage (HV) device region. The regions may be other types of device regions or additional device regions may be provided. For example, a dual gate oxide (DGO) region may be provided for DGO devices. The DGO devices may be used for I/O circuitries. Alternatively, the device may include only a HV region.

The first region, in one embodiment, comprises first and second type active sub-regions 112 and 116. The first and second types are complementary types, forming a complementary type device. For example, the complementary type device comprises a complementary metal oxide semiconductor (CMOS) device. Forming non-complementary or other types of devices is also useful.

The first type active sub-region, for example, comprises a n-type active sub-region and the second type active sub-region comprises a p-type active region. The first type active sub-region comprises a second type doped well 122; the second type active sub-region comprises a first type doped well 124. For example, the first type active sub-region comprises a p-type doped well and the second type active sub-region comprises a n-type doped well. Other configurations of active sub-regions are also useful. P-type dopants can include boron (B), indium (In) or a combination thereof while n-type dopants can include phosphorus (P), arsenic (As), antimony (Sb) or a combination thereof.

A first type transistor 140 is provided in the first type active sub-region and a second type transistor 150 is provided in the second type active sub-region. For example, a n-type transistor is provided in the n-type active sub-region with a p-type doped well while a p-type transistor is provided in the p-type active sub-region with a n-type doped well. The transistors, in one embodiment, are MOS field effect transistors (MOSFETs). Other types of transistors may also be useful.

A transistor, for example, comprises a gate having a gate electrode 144 over a gate dielectric 142. The gate electrode, for example, comprises polysilicon. Other types of gate electrode materials, such as polysilicide or metal silicide, are also useful. Polysilicide or metal silicide gates can be formed by reacting the desired metal with polysilicon. Various types of metal, such as cobalt, titanium or nickel, can be used. Other types of gate electrode materials may also be useful. Furthermore, the gate electrode may be doped with dopants. Doping the gate electrode may depend on the technology. The gate electrode, for example, may be doped with the same dopant type of the transistor type. Doping the gate electrode with other dopant types is also useful. The gate dielectric can be silicon oxide. Other types of gate electrode or gate dielectric materials can also be useful. The material of the gate electrode and gate dielectric may depend on the technology. For example, cobalt silicide gate electrodes may be used for 0.18 µm and 0.13 µm technologies while nickel silicide may be used for 0.09 µm technologies. Other configurations of gate electrode and gate dielectric materials are also useful.

Sidewalls of the gate can be provided with sidewall spacers 148. The sidewall spacers, for example, comprise a dielectric material, such as silicon oxide, silicon nitride or a combination thereof. Other types of materials can be used for the sidewall spacers.

Adjacent to the gate are diffusion regions 146. The diffusion regions serve as, for example, source and drain of the transistor. Extension diffusion regions 147 can be provided. The extension diffusion regions, for example, are shallow diffusion regions which extend under the spacers. The diffusion regions (including the extension diffusion regions) of the first type transistor are doped with the first type dopants and the diffusion regions of the second type transistor are doped with the second type dopants. For example p-type diffusion regions are provided for p-type transistors and n-type diffusion regions are provided for n-type transistors. The depth and dopant concentration of the diffusion regions may depend, for example, on the application, such as voltage requirements.

The HV region includes a HV active region 165. In one embodiment, the HV active region comprises a first type active region. For example, the HV active region comprises a n-type active region. Providing a p-type HV active region is also useful. Furthermore, it is understood that the HV region is depicted with only one active region for purpose of simplification and that the HV region can include numerous HV active regions or sub-regions. For example, the HV active sub-regions can be complementary types of HV sub-regions for complementary types of HV devices.

Isolation regions 180, such as shallow trench isolation (STI) regions are provided to isolate the LV and HV regions as well as active sub-regions within the regions. Other types of isolation regions are also useful.

In one embodiment, the first type HV active region comprises at least first and second portions. The first portion comprises a second type HV channel (or body) well 135 and the second portion comprises a first type HV drift well 136. The HV drift well, for example, defines the type of HV device. For example, a p-type HV active region would have a n-type HV channel well and a p-type HV drift well. In one embodiment, a third or middle portion separates the channel and drift wells. In other embodiments, the first and second portions are contiguous portions. For example, the HV channel and HV drift wells contact each other.

A deep well 132 may be provided in the HV active region, encompassing the HV channel and drift wells. Generally, the deep well comprises dopants of the first type or same as the HV device type. The deep well may be used to isolate the drift well from the substrate. For example, a p-type device will have a n-type deep well. In some cases, the deep well can be optional or the deep well can comprise dopants of the second or opposite type of the HV device type. For example, in the case of a n-type HV device, the deep well can be a p-type or n-type deep well. The different types of deep well selected may depend on the type of substrate. Generally, p-type doped substrates are used for fabricating devices. When p-type substrates are used, the n-type deep well may be optional. This is because the n-type drift well is already different from the p-type substrate. For a n-type substrate, a p-type deep well may be used to isolate the channel well from the substrate. Other configurations of deep wells may also be useful.

As shown, a first type HV device is provided in the first type HV active region. The first type HV device, in one embodiment, comprises a LD device, such as a LDMOS device. The HV device comprises a gate with first and second edges 179a-b or sidewalls.

The gate includes a HV gate electrode 174 over a HV gate dielectric 172. The HV gate electrode, for example, comprises polysilicon. Other types of HV gate electrode materials, such as polysilicide or metal silicide, are also useful. Various types of metal, such as cobalt, titanium or nickel, can be used. Other types of HV gate electrode materials may also be useful. Furthermore, the gate electrode may be doped with dopants. The HV gate electrode, for example, may be doped with the same dopant type of the transistor type. Doping the HV gate electrode with other dopant types is also useful. The HV gate dielectric can be silicon oxide. Other types of HV gate dielectric materials can also be useful.

In one embodiment, the material of the HV gate electrode and HV gate dielectric may depend on the CMOS process and/or technology. In one embodiment, the material of the HV gate electrode and HV gate dielectric may depend on the CMOS process for LV devices and/or technology. For example, cobalt silicide gate electrodes may be used for 0.18 µm and 0.13 µm technologies while nickel silicide may be used for 0.09 μm technologies. Other configurations of gate electrode and gate dielectric materials are also useful.

Sidewalls of the gate can be provided with sidewall spacers 178. The sidewall spacers, for example, comprise a dielectric material, such as silicon oxide, silicon nitride or a combination thereof. Other types of materials can be used for the sidewall spacers.

In one embodiment, the various gate elements of the HV gate, such as gate electrode, gate dielectric and spacers are of the same type of material as the LV devices in the LV region. This facilitates process compatibility for forming HV and LV devices.

The HV gate overlaps the channel and drift wells in the first and second portions of the HV active region. A drift isolation region 180*a* may be provided within the drift well 136 on the high voltage side of the HV device. The drift isolation region 180*a* can improve breakdown voltage of the HV device due to high voltage. For example, the drift isolation region is particularly useful to sustain high voltages for applications beyond about 10V. As shown, the drift isolation region 180*a* is disposed in the drift well 136 under the gate. Disposing the drift well at other positions, such as partially underlying the gate may also be useful.

A first type drain diffusion region 176*b* is provided between the drift isolation region 180*a* and isolation region 180 which isolates the HV active region from other sub-active regions in the HV region. A first type source diffusion region 176*a* is provided in the channel well 135 of the first type HV active region. A source extension region 177 can be provided which extends under the spacer on the channel side of the HV gate. The first type source and drain diffusion regions, for example, comprise a p-type diffusion regions for a p-type HV active region. Providing n-type diffusion regions for a n-type HV active region is also useful. The dopant depth and concentration of the diffusion regions may be selected depending on the application. In one embodiment, the dopant depth and concentration of diffusion regions may be the same as those of LV devices. Other dopant depths and concentrations are also useful.

A second type body contact region 171 may be provided in the first portion of the HV active region. As shown, the second type body contact region 171 is between the source diffusion region 176*a* and the isolation region 180. The second type body contact region comprises second type dopants. In one embodiment, dopant depth and concentration of the body contact region may be the same as the diffusion regions of the LV devices. Other dopant depths and concentrations are also useful. The body contact region 171 provides electrical coupling to the channel well 135.

An edge 133 of the channel well 135 extends below the gate on the source side of the gate. The edge 133, for example, can be referred to as the channel edge of the channel well. The channel edge of the channel well 135 and the first edge 179*a* of the gate on the source side define a channel of the HV transistor having an effective channel length L.

The effective channel length, in one embodiment, is controlled by ion implantation which is self-aligned to the gate edge. For example, dopant ions are implanted using an implant mask through the gate electrode or a hard mask and the gate electrode. In one embodiment, the implant mask is also used to pattern the channel edge of the HV gate. The effective channel length may be controlled by channel or body implant conditions selected to satisfy threshold voltage and breakdown voltage requirements. For example, shorter effective channel length may be achieved by decreasing tilt angle, implant energy or dosage and vice-versa.

With the channel well being self-aligned to the gate edge of the implant, process overlay issues are avoided. Very short effective channel lengths with very low $Rds_{on}$ can be achieved, enabling high current to pass through a small area. This is particularly useful for technologies beyond 0.35 μm, such as, for example, 0.25 μm, 0.18 μm and 0.13 μm technologies.

Smaller area requirements for power management applications with reduced power dissipation increases performance while reducing costs.

In one embodiment, the effective channel length L is less than 0.4 μm. In other embodiments, the effective channel length is less than 0.3 μm. In yet another embodiment, the effective channel length is less than 0.25 μm. Other effective channel lengths may also be useful, for example, depending on the application.

Figure 2A:
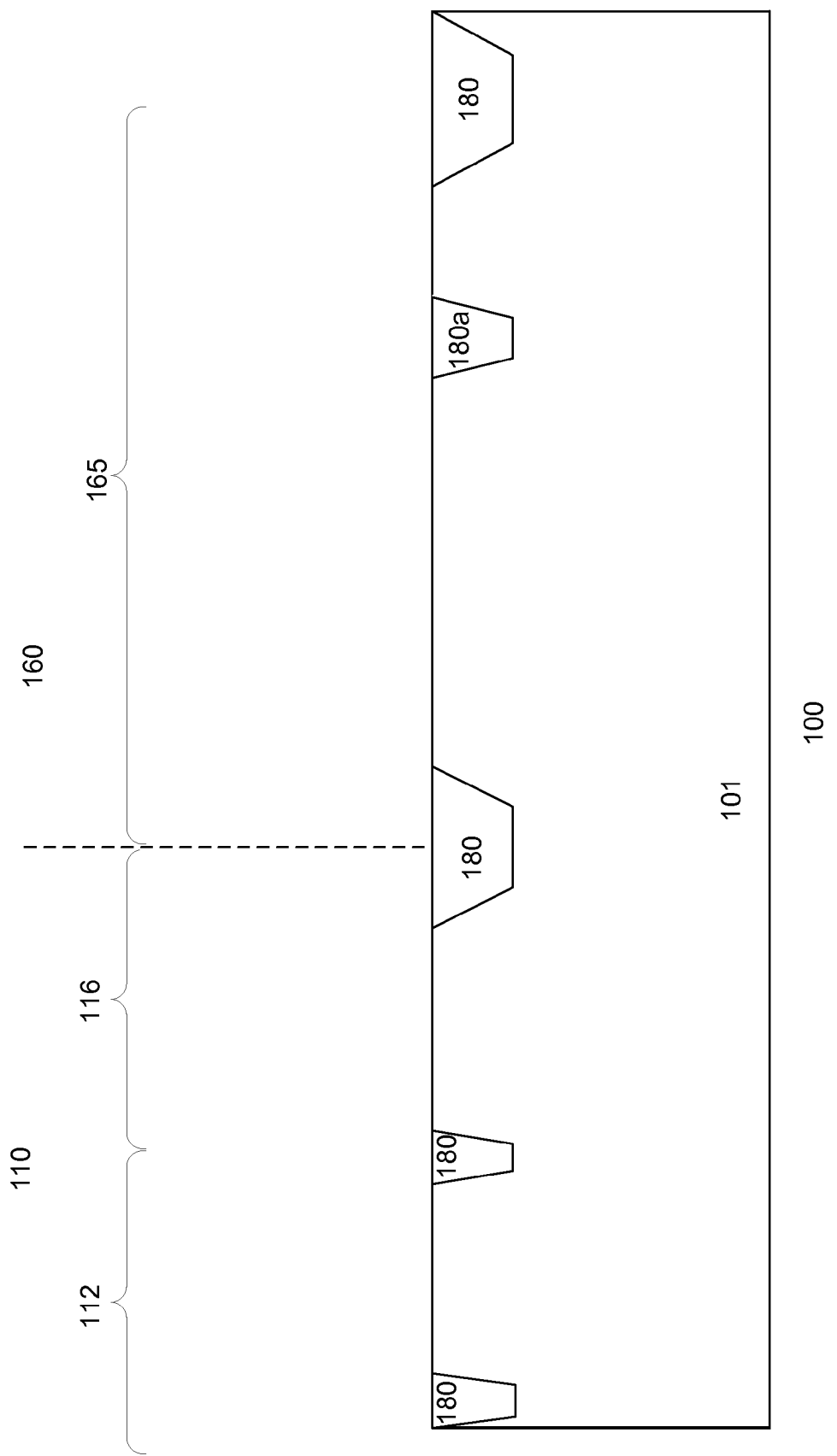
FIGS. 2a-g show an embodiment of a process for forming a device.

FIGS. 2*a-g* show cross-sectional views of an embodiment of a process for forming a device or IC 100. Referring to FIG. 2*a*, a substrate 101 is provided. The substrate can comprise a silicon substrate, such as a lightly p-type doped substrate. Other types of substrates, including n-type doped substrates, silicon germanium or silicon-on-insulator (SOI), are also useful.

As shown, first and second device regions 110 and 160 are defined on the substrate. The first region, for example, comprises a LV device region while the second region comprises a HV device region. Other types of device regions or additional device regions may be provided. Alternatively, the device may include only a HV region.

The LV device region 110 can be defined with first and second type active sub-regions 112 and 116. In one embodiment, the first and second type active sub-regions are complementary type active sub-regions to form a complementary device such as a CMOS device. Forming non-complementary or other types of devices is also useful.

As for the HV device region 160, a HV active region 165 is defined therein. In one embodiment, the HV active region 165 can be a first or second type HV active region. Although only one HV active region is depicted, it is understood that the HV device region may include additional HV active regions or sub-regions. The HV active sub-regions can be complementary HV active sub-regions.

The substrate is also prepared with isolation regions 180 to separate the device regions as well as other active device sub-regions. In one embodiment, the isolation regions 180 comprise STIs. Various conventional processes can be employed to form the STI regions. For example, the substrate can be etched using conventional etch and mask techniques to form trenches which are then filled with dielectric materials such as silicon oxide. Chemical mechanical polishing (CMP) can be performed to remove the excess dielectric materials and provide a planar substrate top surface. Other processes or materials can also be used to form the STIs.

Figure 2B:
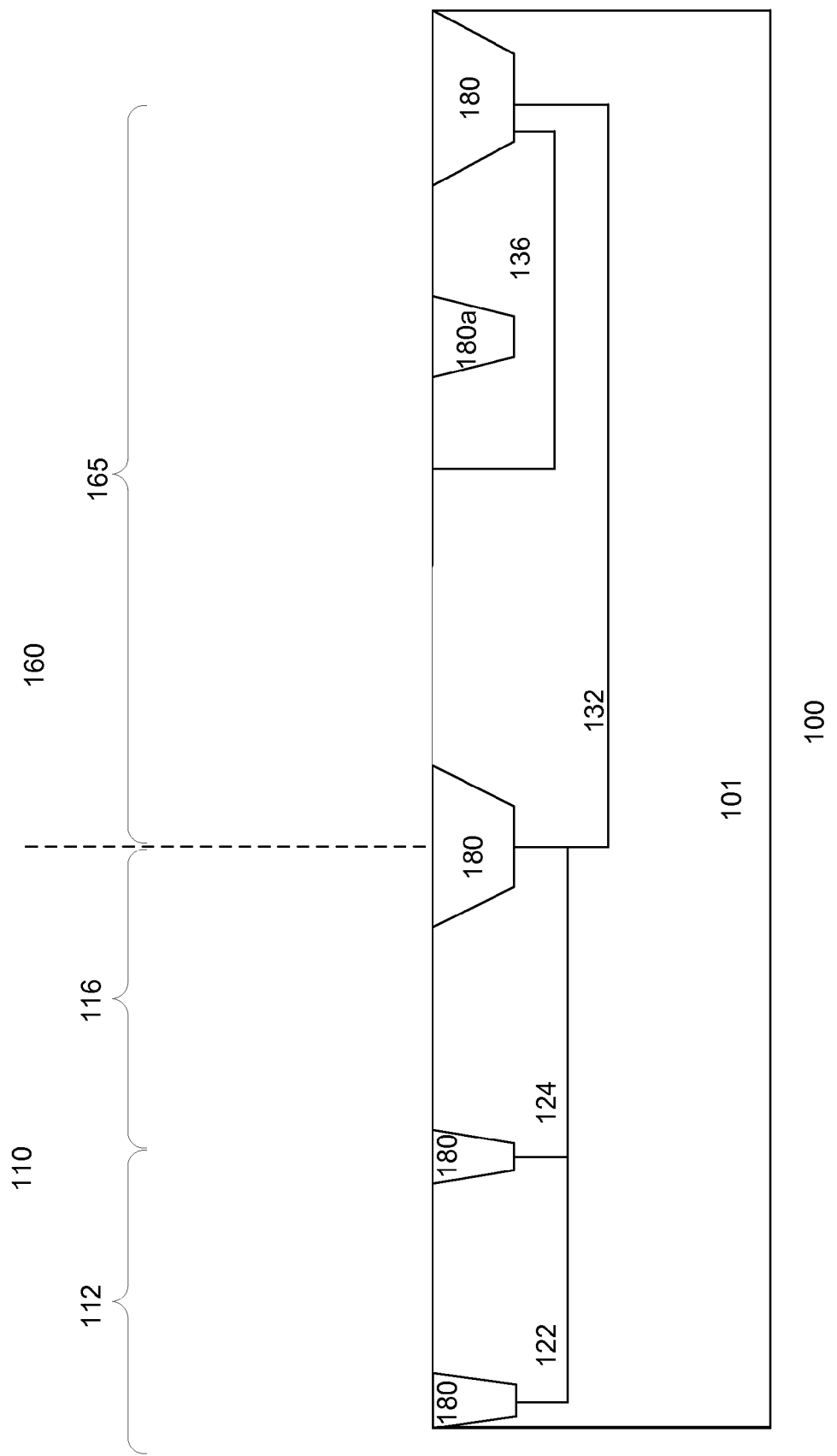

In FIG. 2*b*, the doped wells for the active regions of the device regions are formed. In one embodiment, a first type doped well 124 is formed in the second type LV active sub-region 116 and a second type doped well 122 is formed in the first type LV active sub-region 112. For example, a n-type doped well is formed in the p-type active sub-region and a p-type doped well is formed in the n-type active sub-region.

In the HV active region 165, it includes at least first and second portions. For example, the first portion corresponds to a drain portion and the second portion corresponds to a source portion. In some embodiments, a third or middle portion is provided to separate the first and second portions. Alternatively, the first and second portions are contiguous portions without a middle portion.

In one embodiment, a doped well 136 is formed in the drain portion of the HV active region. The doped well, for example, is a drift well of the HV device. The drift well comprises the same type as the HV active region. In the case of a first type HV active region, the drift well comprises a first type. For example, a n-type drift well is provided for a n-type HV active region.

A drift STI region 180a may be optionally provided in the drift well 136. The drift STI region is disposed in the drift well to improve reliability of high voltage devices. For example, the drift STI region improves breakdown reliability of the HV device. The drift STI region can be formed at the same time as the other STI regions.

A deep HV well 132 may be provided in the HV active region 165. As shown, the deep HV well 132 is formed in the whole HV active region 165 and encompasses the first and second portions of the HV active region 165. The deep HV well comprises an opposite type as the drift well and the HV active region. In the case of a first type HV active region, the deep well comprises a second type. For example, a p-type deep well is provided for a n-type HV active region.

The depth and concentration of dopants of the various wells may depend on, for example, application. For example, higher voltage applications may require lower doping concentration of dopants and greater depth of the wells. In one embodiment, the depth of the deep well 132 is about 3 µm with a dopant concentration of about $5E16$ $cm^{-3}$. For the drift well 136, it may have a depth of about 1.5 µm with a dopant concentration of about $5E17$ $cm^{-3}$. Other depths and dopant concentrations are also useful for the wells.

As described, the STI regions are formed prior to forming the various doped wells. Other process schemes, such as forming the STI regions after the various doped wells are formed may also be useful.

The doped wells can be formed by ion implantation. P-type dopants can include boron (B), $BF_2$ (boron compounded with fluorine), indium (In) or a combination thereof while n-type dopants can include phosphorus (P), arsenic (As), antimony (Sb) or a combination thereof. Generally, the first and second types of the active regions are formed selectively in separate processes. For example, the n-type regions can be implanted with n-type dopants while an implant mask prevents doping of the p-type regions.

In one embodiment, the wells of the HV region are formed separately from the LV regions. For example, the LV wells can be formed first followed by the HV wells. Forming the HV wells prior to the LV wells is also useful. The different types of LV wells can be formed in separate processes and the different types of HV wells can also be formed in separate processes. For example, the first type and second type wells in the LV region are formed in separate implant processes. Similarly, the different types of wells in the HV region are formed in separate implant processes.

A doped well can be formed by a single implant process or multiple implant processes. In multiple implant processes, dopants can be implanted at different energy levels to achieve the desired doping profiles. In the case of a single implant process, a high temperature drive-in process is performed to achieve the desired doping profile.

A single implant process may be employed to, for example, form deep wells. For a n-type deep well, phosphorus may be implanted with a dopant concentration of about $6E12$ $cm^{-2}$ at an energy level of about 2000 KeV followed by a two-hour drive-in at a temperature of about 1100° C. Single implant processes may also be used to form other types of wells. Forming wells using multiple implant processes may also be useful. For example, LV wells may be formed by multiple implant processes.

Figure 2C:
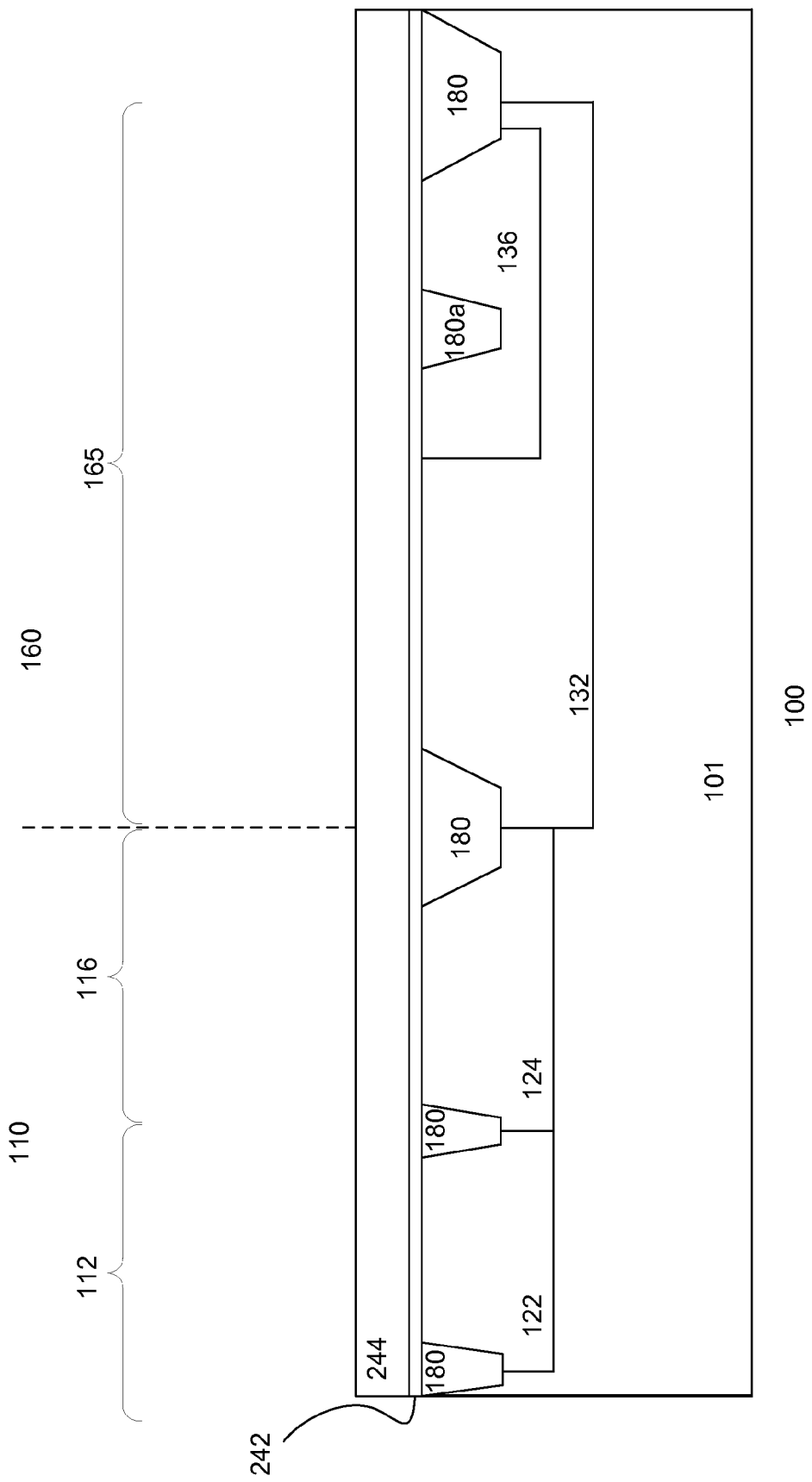

In FIG. 2c, various layers of the gate are formed on the substrate. In one embodiment, a gate dielectric layer 242 is formed over the substrate. The gate dielectric layer, for example, comprises silicon oxide. Other types of dielectric materials, such as silicon oxynitride, may also be useful. Alternatively, high-k, low-k or composite of dielectric materials may be used. The thickness of the gate dielectric layer 242 may be about 30 Å for 1.8V gate voltage transistors. Other thicknesses may also be useful. The thickness, for example, may depend on the gate voltage applications. For example, higher gate voltages may require thicker gate dielectric layers. In one embodiment, the gate dielectric layer is formed by thermal oxidation. Other techniques, such as chemical vapor deposition (CVD), can also be used to form the gate dielectric layer.

A gate electrode layer 244 is deposited on the gate dielectric layer 242. The gate electrode layer comprises, in one embodiment, polysilicon (poly). The gate electrode layer 244 can be formed as an amorphous or non-amorphous layer. For amorphous deposited layer, subsequent processing can be performed to crystallize it. Other types of gate electrode materials are also useful. For example, the polysilicon can be subsequently processed to form polysilicide or metal gates. The thickness of the gate electrode layer may be about 2000 Å or less. In another embodiment, the thickness of the gate electrode layer is about 2500 Å or less. In yet another embodiment, the thickness of the gate electrode layer can be about 4000 Å or less. For example, in the case of polysilicide gates, the polysilicon may be about 2000 Å while the tungsten is about 2000 Å. Other thicknesses are also useful. Various techniques can be used to form the gate electrode layer. For example, polysilicon can be deposited by CVD while metal can be deposited by sputtering. Other techniques, depending on the material, may also be useful.

Figure 2D:
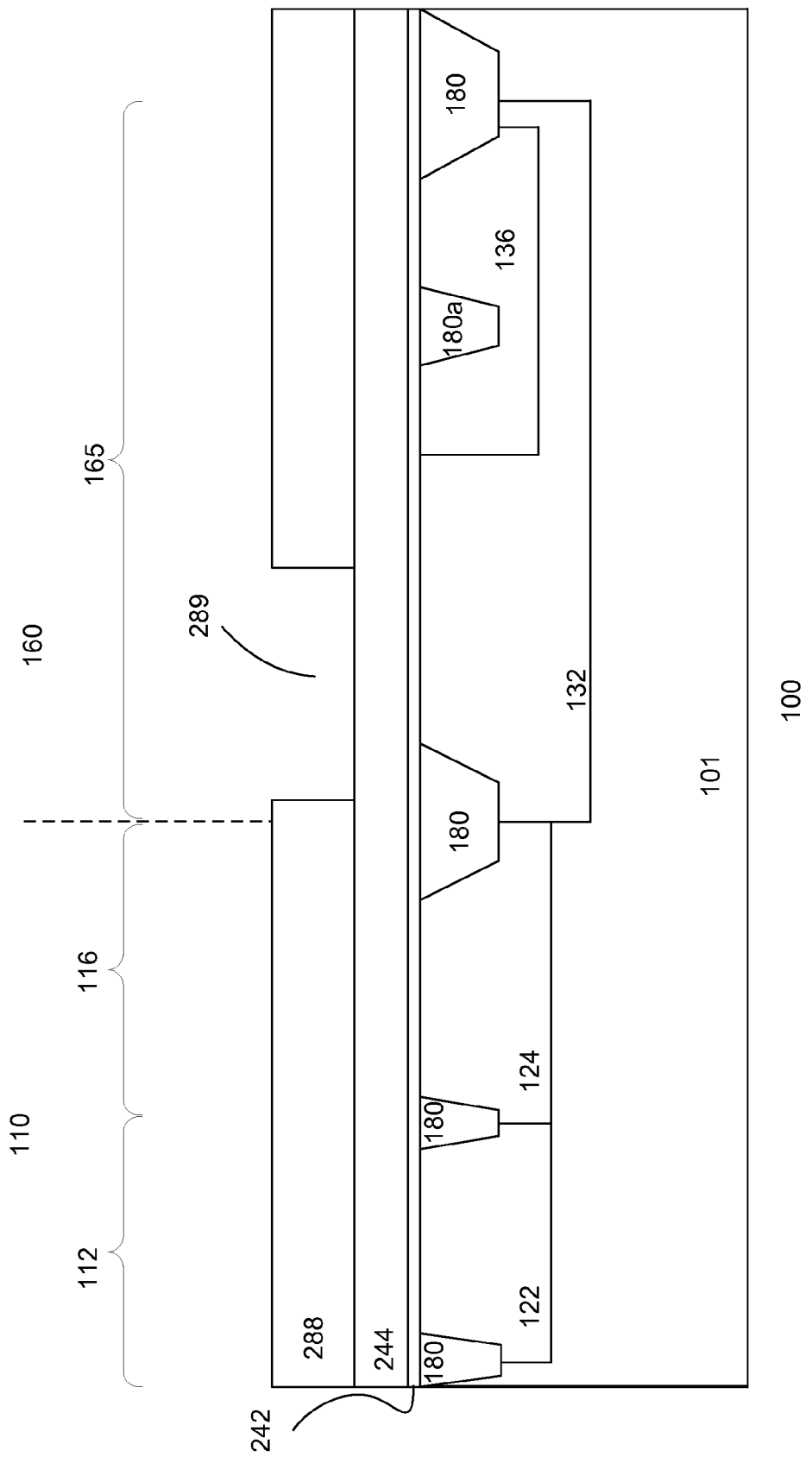

Referring to FIG. 2d, a mask layer 288 is formed on the substrate, covering the gate electrode layer. In one embodiment, the mask layer comprises photoresist. The mask is patterned as desired. To pattern the mask layer, photolithography can be employed. For example, the mask can be selectively exposed to an exposure source through a lithographic mask. Depending on whether a positive or negative resist is used, the exposed or unexposed portions are removed by development. To enhance lithographic resolution, an ARC layer (not shown) may be provided beneath the mask layer.

The mask layer 288 is patterned to form an opening 289 to expose a portion of the gate electrode layer 244. In one embodiment, the opening corresponds to the opening for the channel well implant. For example, the mask layer serves as the channel well implant mask. The ARC layer may be patterned with the mask layer. Subsequently patterning the ARC layer may also be useful.

Figure 2E:
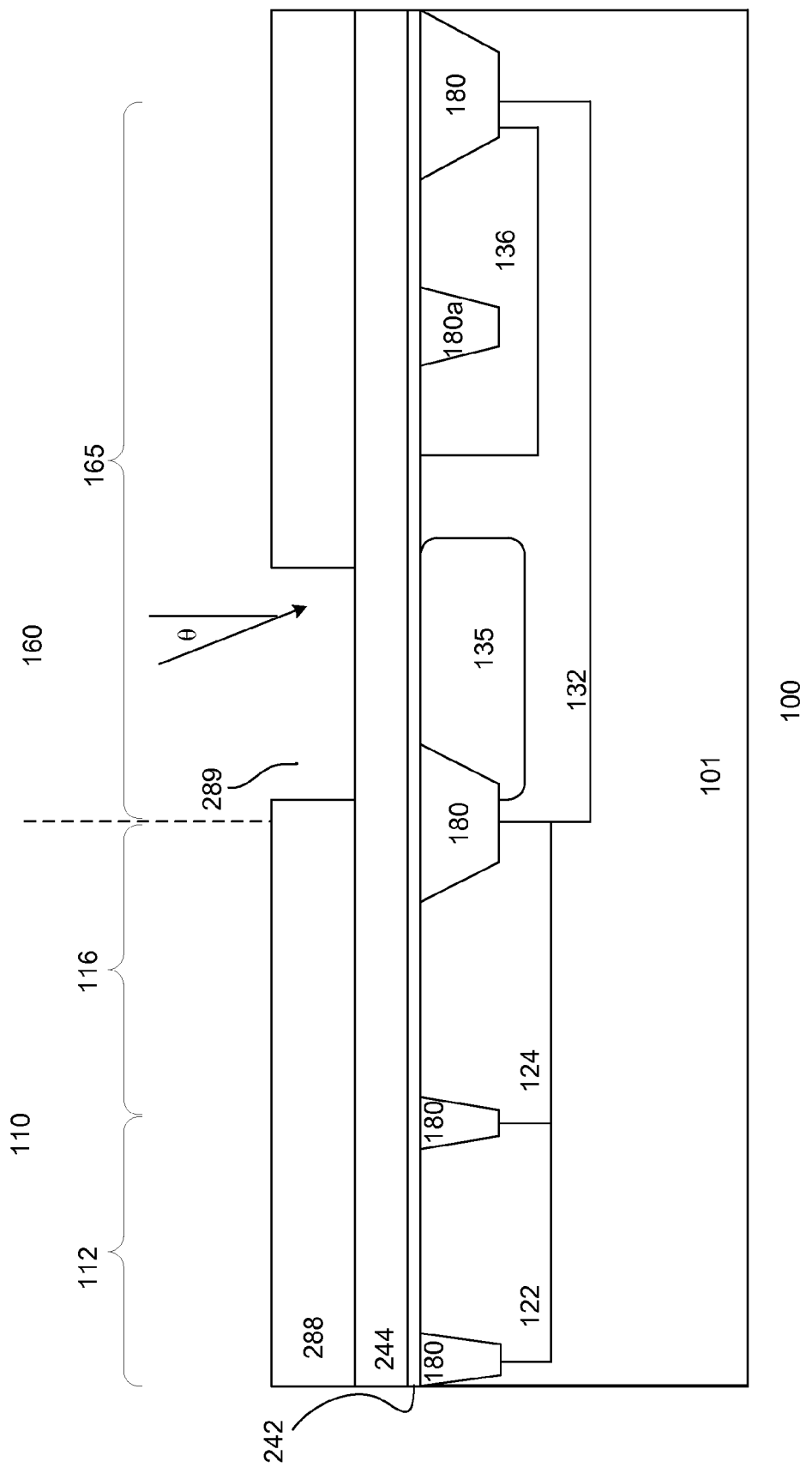

In FIG. 2e, the substrate is implanted with dopants to form a channel well 135. In one embodiment, dopants of the opposite type as the type of the HV active region are implanted. For example, p-type dopants are implanted into the p-type deep well of a n-type HV active region. In one embodiment, the dopants are implanted at an angle to form a channel from the gate edge to the edge of the channel well. The implant angle θ can be in a range of about 1 to 45°. Other implant angles may also be useful. The implant conditions can be varied depending on application requirements. For example, the angle, dose and energy can be selected to achieve the desired effective channel length.

In one embodiment, the channel well is formed by multiple implants. For example, the channel well can be formed by at least two tilt and rotate implants. In one embodiment, the implant comprises a quad implant. A quad implant comprises 4 tilted angled implants, each rotated by a rotation angle. For example, a p-type channel well can be formed with a quad implant at a tilt angle of about 30° with rotation angle of about 45° with a boron dose of about 2E13 $cm^{-2}$ at an energy level of about 130 KeV. Other tilt angles, rotation angles, doses and energy levels are also useful. For example, a quad implant can comprise a tilt angle of about 7° with rotation angle of about 45° with a boron dose of about 2E13 $cm^{-2}$ at an energy level of about 150 KeV.

Figure 2F:
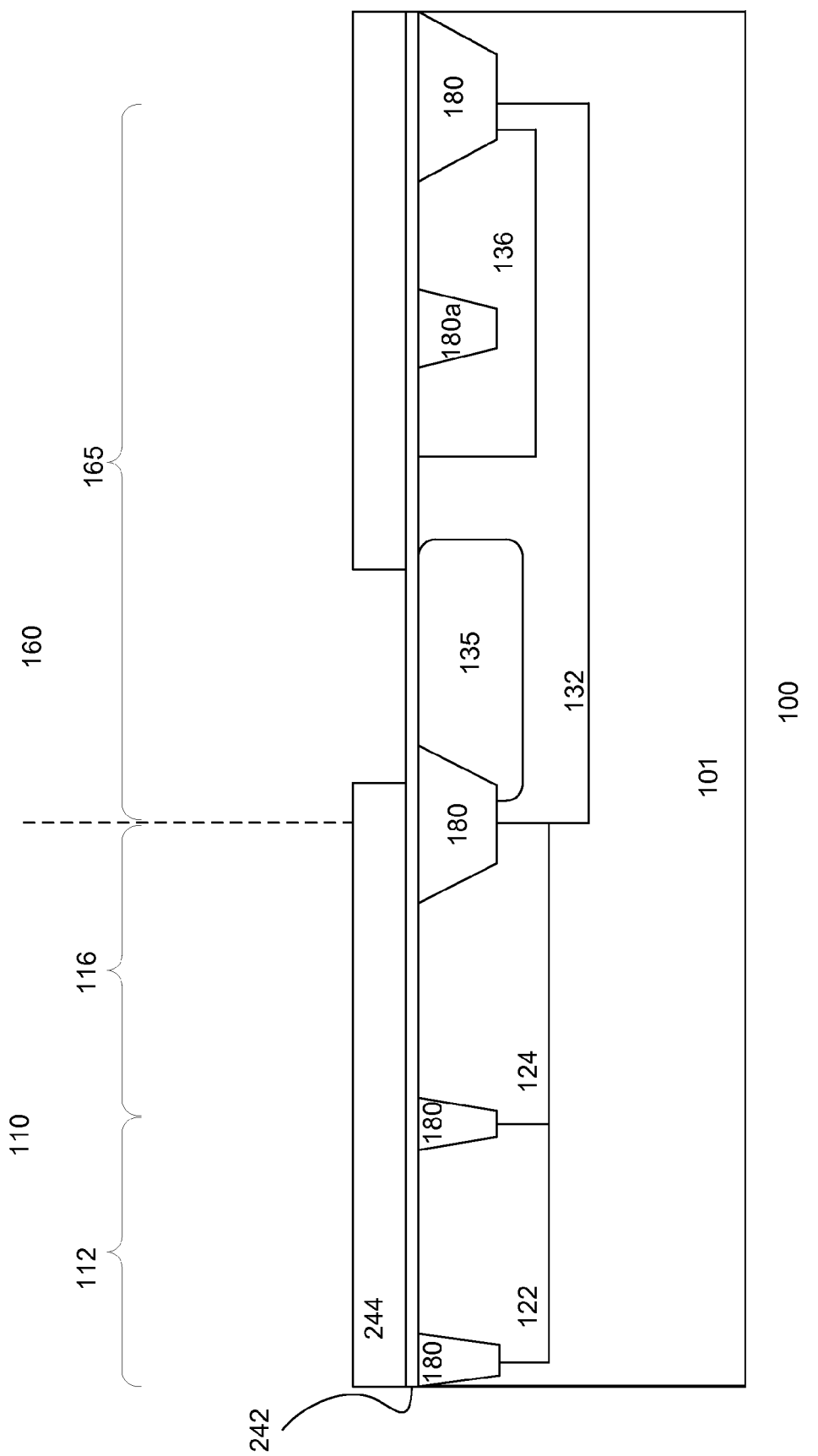

After forming the channel doped well 135, exposed portions of the gate electrode layer 244 are removed, as shown in FIG. 2f. In one embodiment, an anisotropic etch, such as a reactive ion etch (RIE) is performed to remove exposed portions of the gate electrode layer. The removal of the exposed portions of the gate electrode layer, in one embodiment, forms a first edge of a HV gate. The first edge, in one embodiment, corresponds to the source side of the HV gate. As shown, the gate dielectric layer 242 serves as an etch stop for etching the gate electrode layer. Leaving the gate dielectric layer can be advantageous since it can serve as an implant mask for subsequent ion implantation to protect the substrate from implant damage. Alternatively, the exposed portion of the gate dielectric layer can be removed. Removing the gate dielectric layer 242 to expose the substrate may also be useful. After etching the gate electrode layer, the mask layer 288 is removed.

As described, the implant mask, in one embodiment, serves as a channel well implant mask as well as a mask for patterning the first edge (e.g., source side) of the HV gate. By using the same mask to form the channel well and source side of the gate, the channel is self-aligned to the gate edge. This enables the channel length of the HV device to be well controlled to produce very short effective channel lengths to reduce $Rds_{on}$ performance. In one embodiment, the effective channel length L is less than 0.4 µm. In other embodiments, the effective channel length is less than 0.3 µm. In yet another embodiment, the effective channel length is less than 0.25 µm.

Figure 2G:
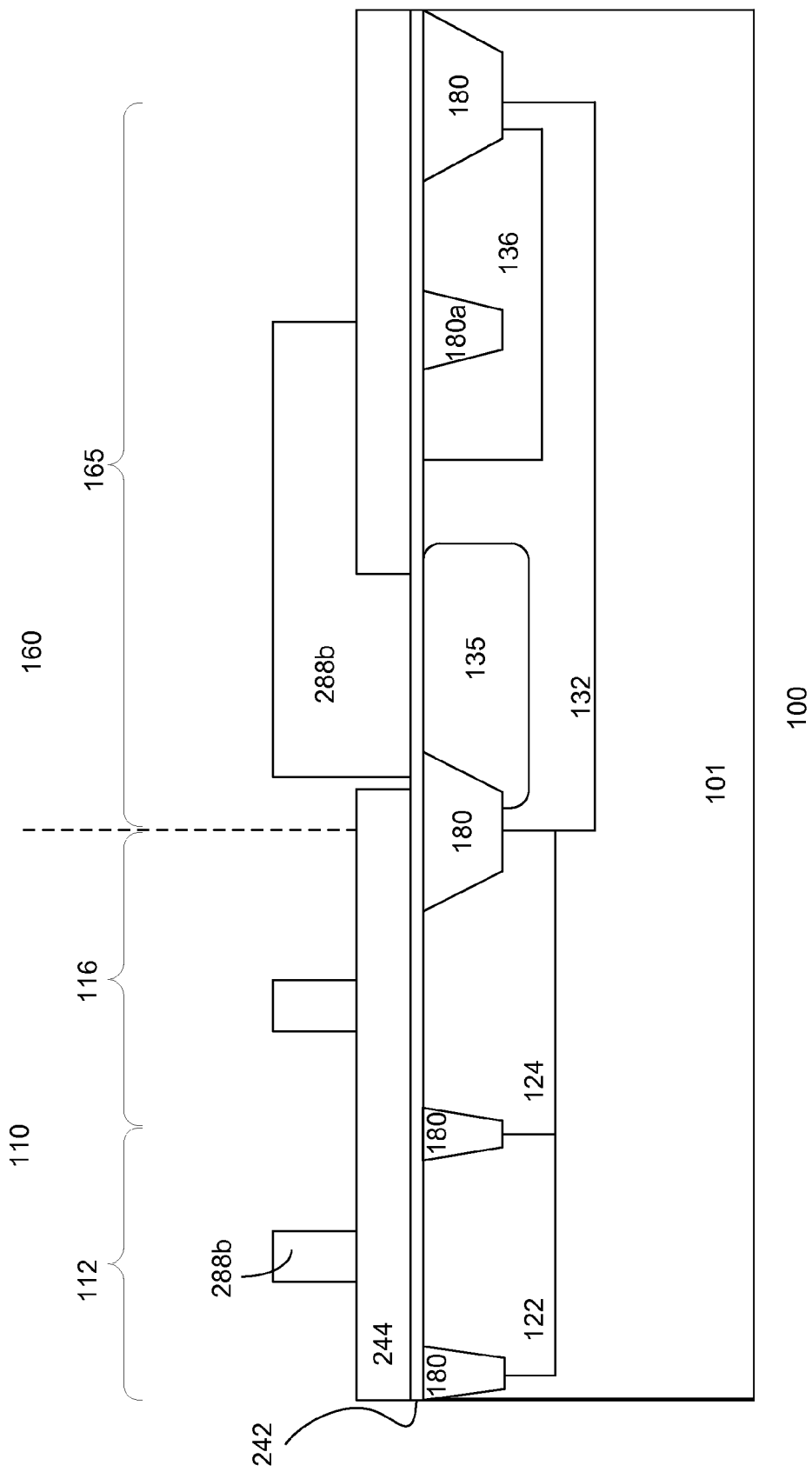

Referring to FIG. 2g, another mask layer 288b is formed on the substrate and patterned. The mask layer is patterned to expose portions of the gate electrode layer 244 to be removed, protecting portions corresponding to gates of the LV devices. For example, the mask serves as a gate mask. Additionally, the mask layer 288b protects the source portion of the HV region and the gate of the HV device. The exposed portions of the gate electrode layer 244 are removed to form gates of both the LV and HV devices.

After the gates are formed, the process continues to form the device, as illustrated in FIG. 1. The process, for example, includes forming extension regions 147 by ion implantation, followed by forming spacers 148 and 178 and diffusion regions 146 and 176. The different types of extension and diffusion regions can be formed in different processes. For example, n-type diffusion regions are formed in one implant process and p-type diffusion regions are formed in another process. Furthermore, the diffusion and extension regions of the different device regions can be formed separately. Silicide gates and contacts can be formed after the diffusion regions are formed. For example, metals, such as cobalt are deposited on the substrate 101 and reacted to form silicide contacts and gates. The contacts and gates can be formed in the same or different processes. Unreacted metals are removed. A pre-metal and an inter-level dielectric layer can be formed in which contacts and interconnects are formed. Additional interconnect levels can be formed by, for example, dual damascene techniques. Final passivation, dicing, assembly and testing may be performed to complete the IC.

Figure 3A:
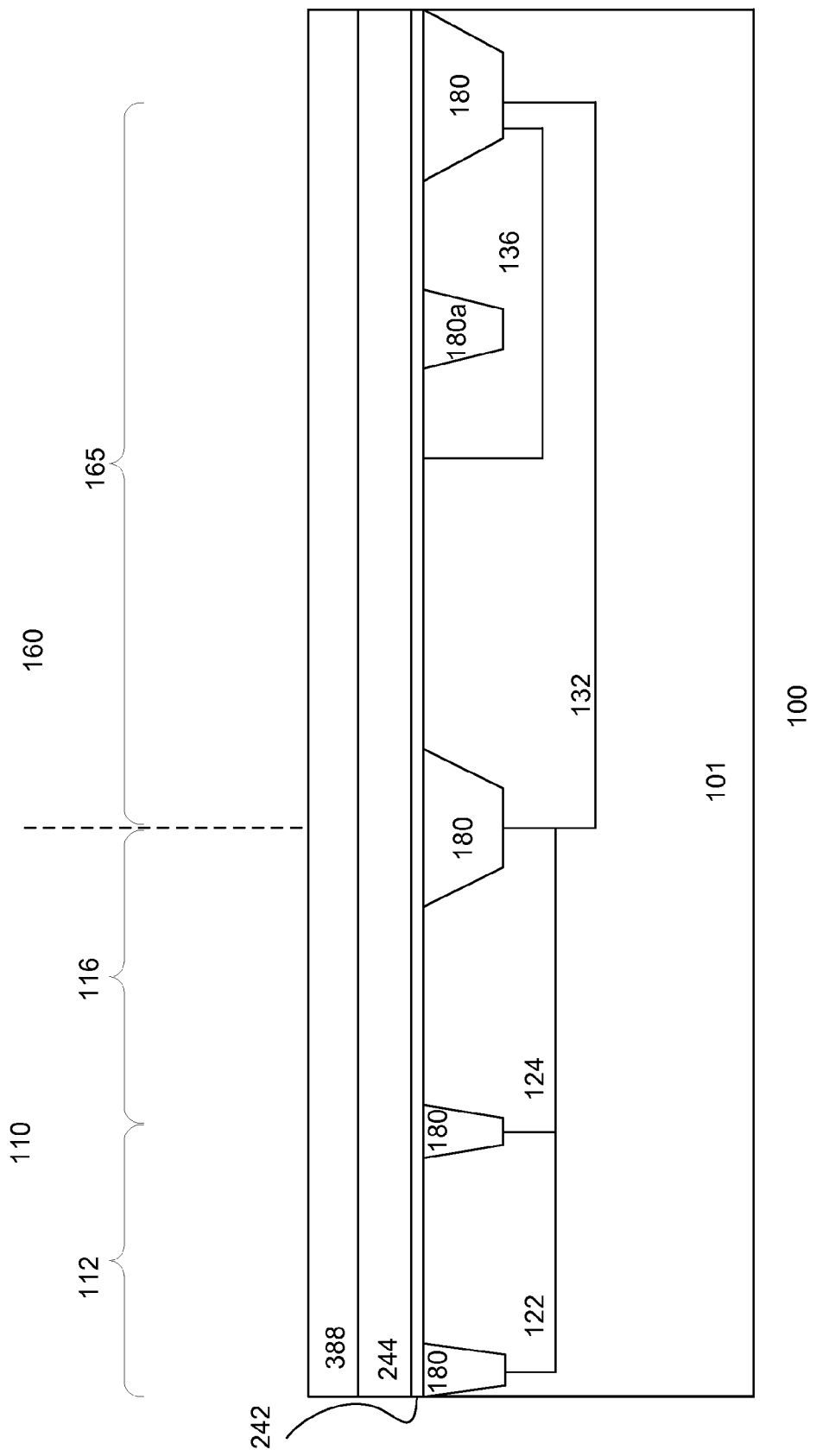
FIGS. 3a-g show an alternative embodiment of a process for forming a device.

An alternative embodiment of a process of forming a device 100 is shown in FIGS. 3a-g. Referring to FIG. 3a, a partially processed device is shown. The partially processed device is similar to that shown in FIG. 2c. A hard mask 388 is formed on the gate electrode layer 244. The hard mask, for example, comprises silicon oxide. In one embodiment, the hard mask 388 is formed by CVD. The thickness of the hard mask, for example, is about 40 nm. Other materials, techniques or thicknesses may also be useful. For example, the hard mask may be formed from silicon nitride or other types of materials.

Figure 3B:
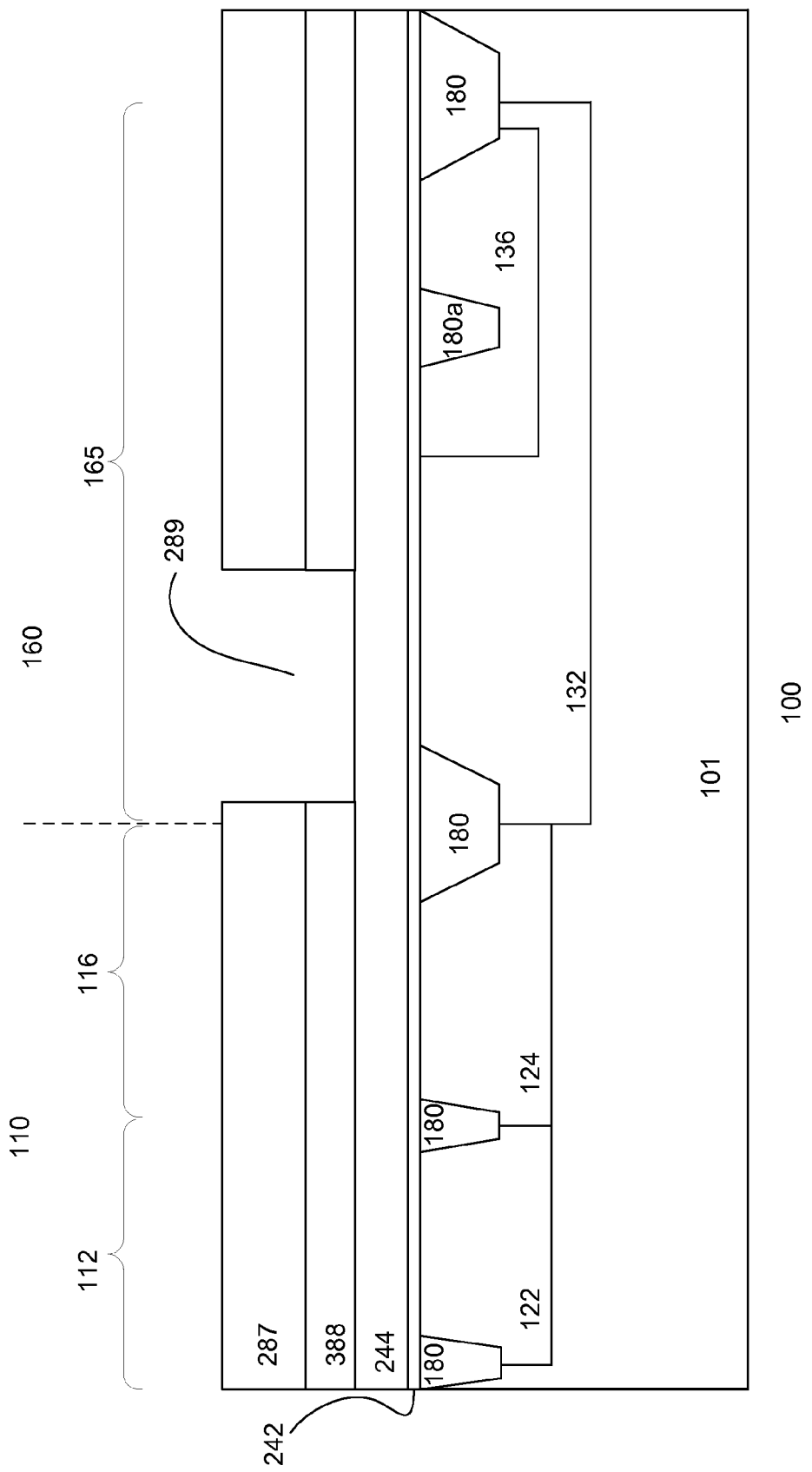

Referring to FIG. 3b, a soft mask 287, such as photoresist, is formed on the hard mask 388. The soft mask can be patterned by photolithographic techniques to form an opening 289 which can serve as a channel implant mask. An ARC layer can be provided between the soft mask 287 and the hard mask 388. The pattern of the soft mask is transferred to the hard mask by, for example, RIE.

Figure 3C:
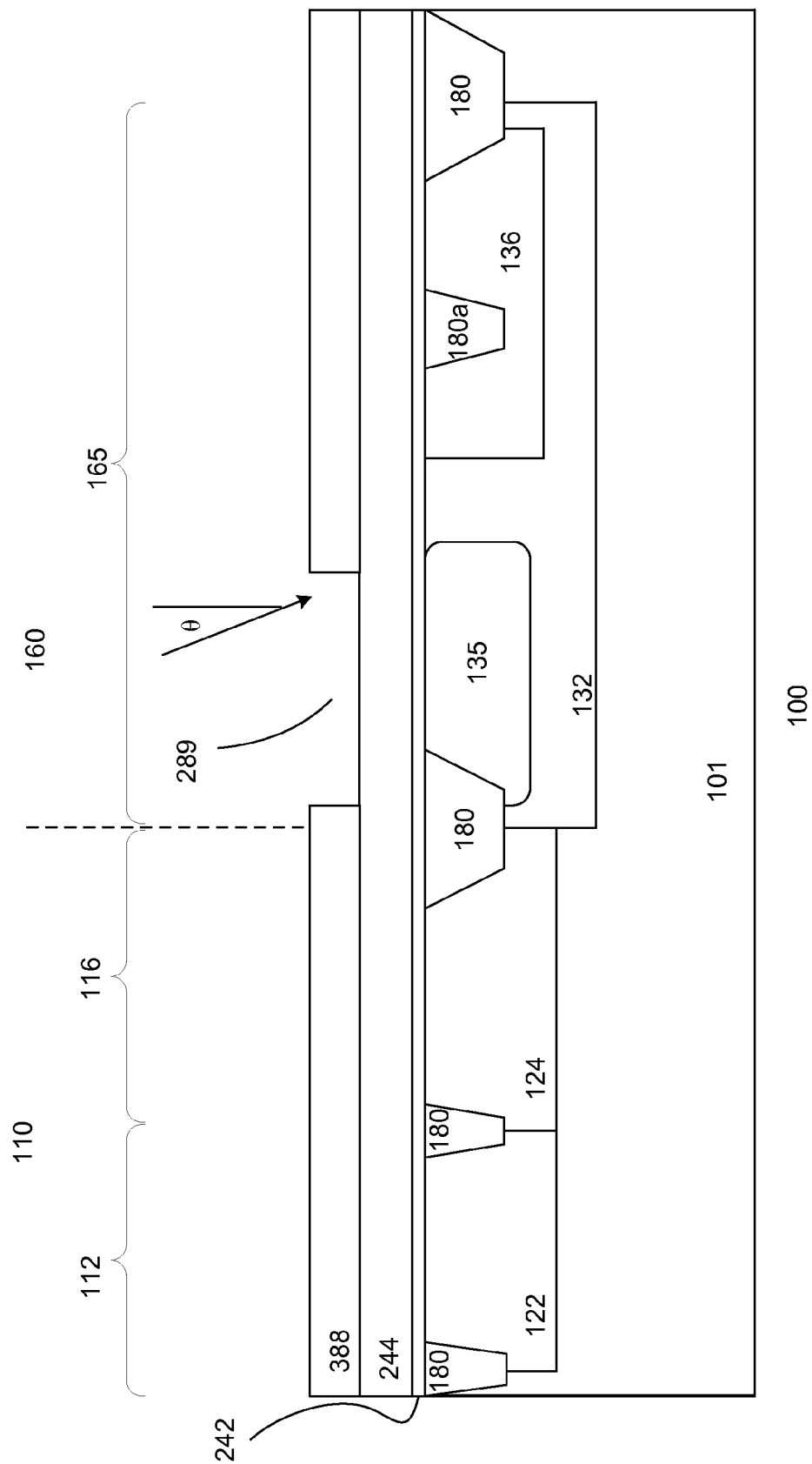

In one embodiment, the soft mask layer is removed after patterning of the hard mask, as shown in FIG. 3c. The substrate is implanted with dopants to form a channel doped well 135. In one embodiment, dopants of the opposite type as the type of the HV active region are implanted. For example, p-type dopants are implanted into the p-type deep well of a n-type HV active region.

In one embodiment, the dopants are implanted at an angle to form a channel from the gate edge to the edge of the channel well. The implant angle θ can be in a range of about 1 to 45°. Other implant angles may also be useful. The implant conditions can be varied depending on application requirements. For example, the angle, dose and energy can be selected to achieve the desired effective channel length.

In one embodiment, the channel well is formed by multiple implants. For example, the channel well can be formed by at least two tilt and rotate implants. In one embodiment, the implant comprises a quad implant. A quad implant comprises 4 tilted angled implants, each rotated by a rotation angle. For example, a p-type channel well can be formed with a quad implant at a tilt angle of about 30° with rotation angle of about 45° with a boron dose of about 2E13 $cm^{-2}$ at an energy level of about 130 KeV. Other tilt angles, rotation angles, doses and energy levels are also useful. For example, a quad implant can comprise a tilt angle of about 7° with rotation angle of about 45° with a boron dose of about 2E13 $cm^{-2}$ at an energy level of about 150 KeV.

Figure 3D:
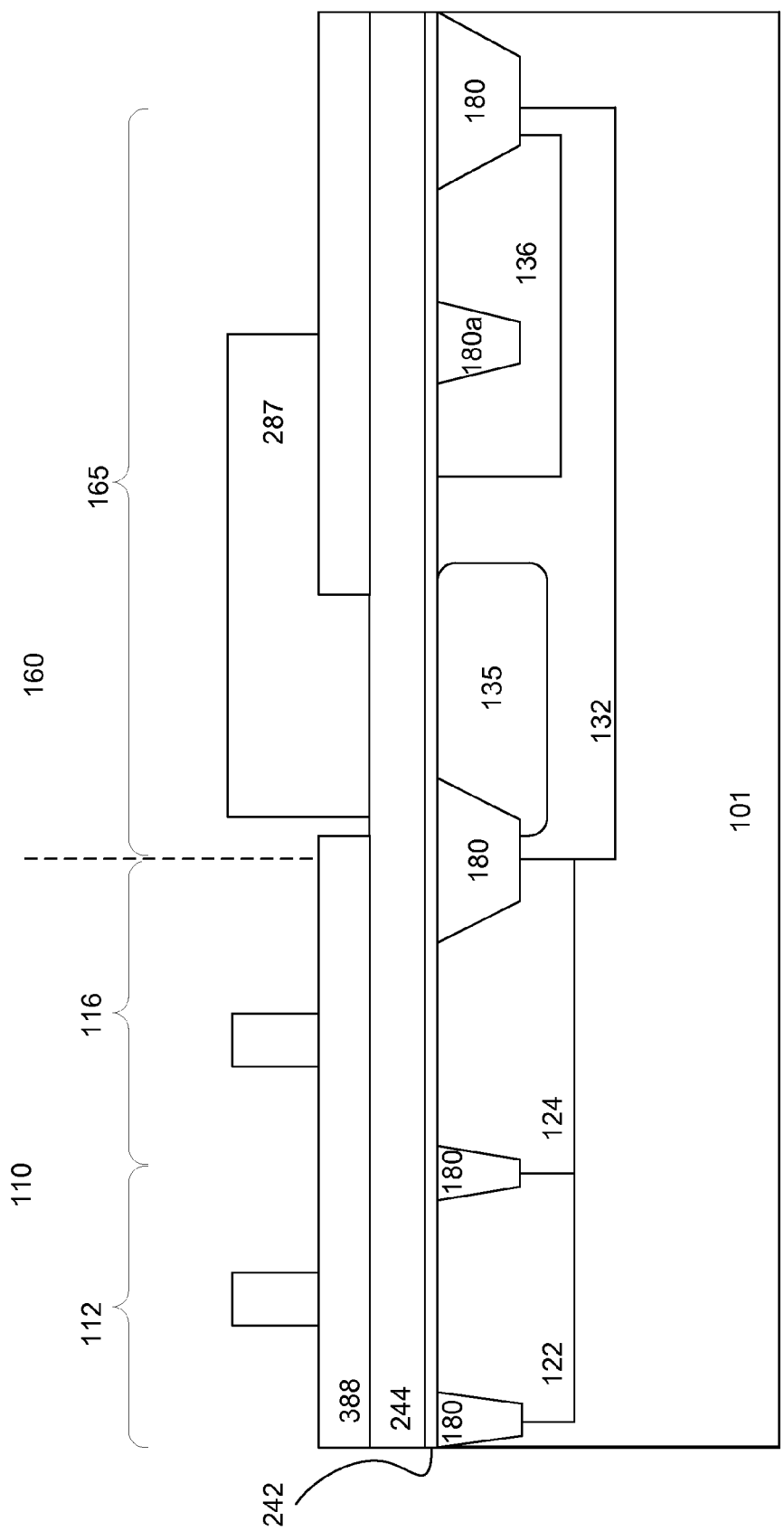
Figure 3E:
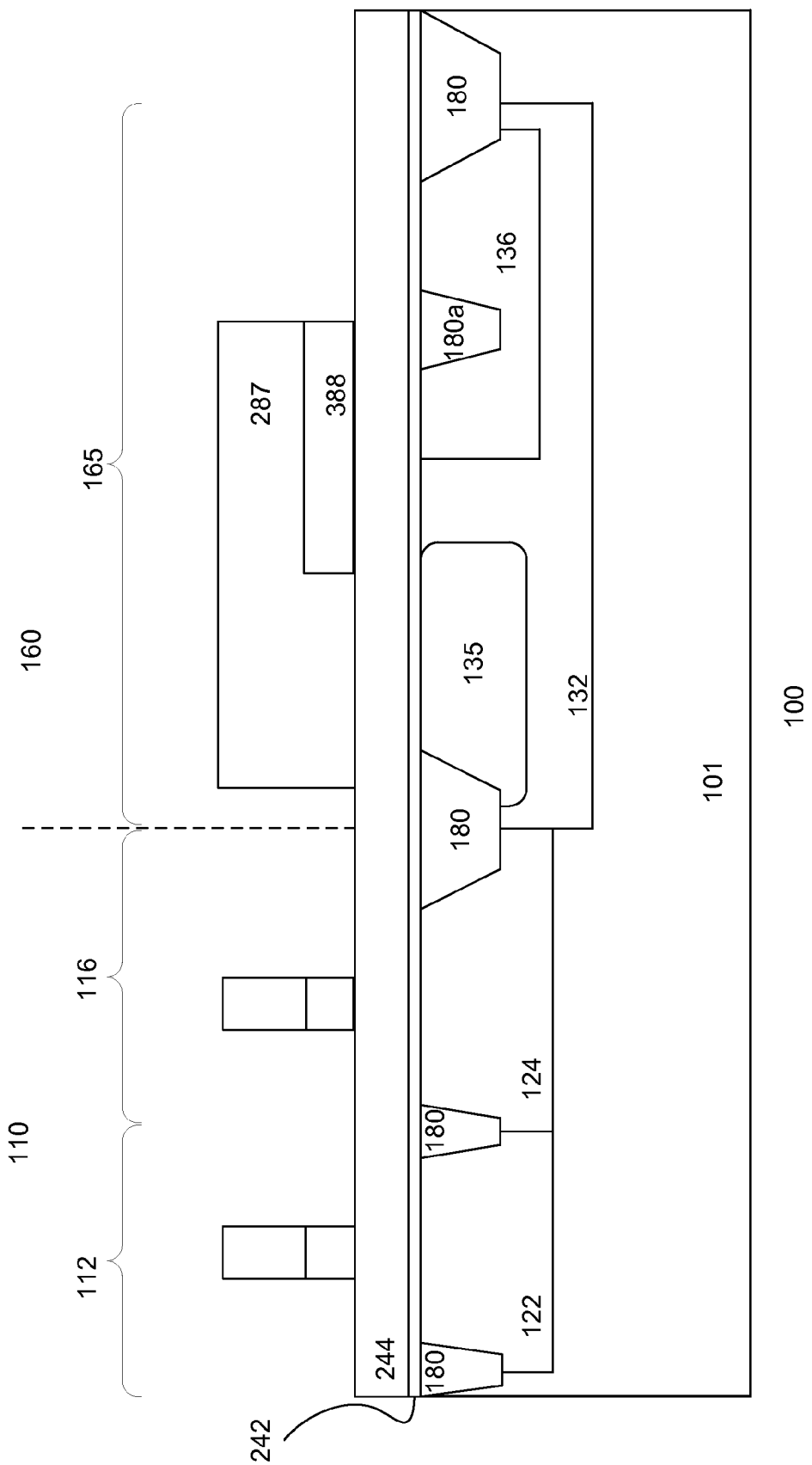
Figure 3F:
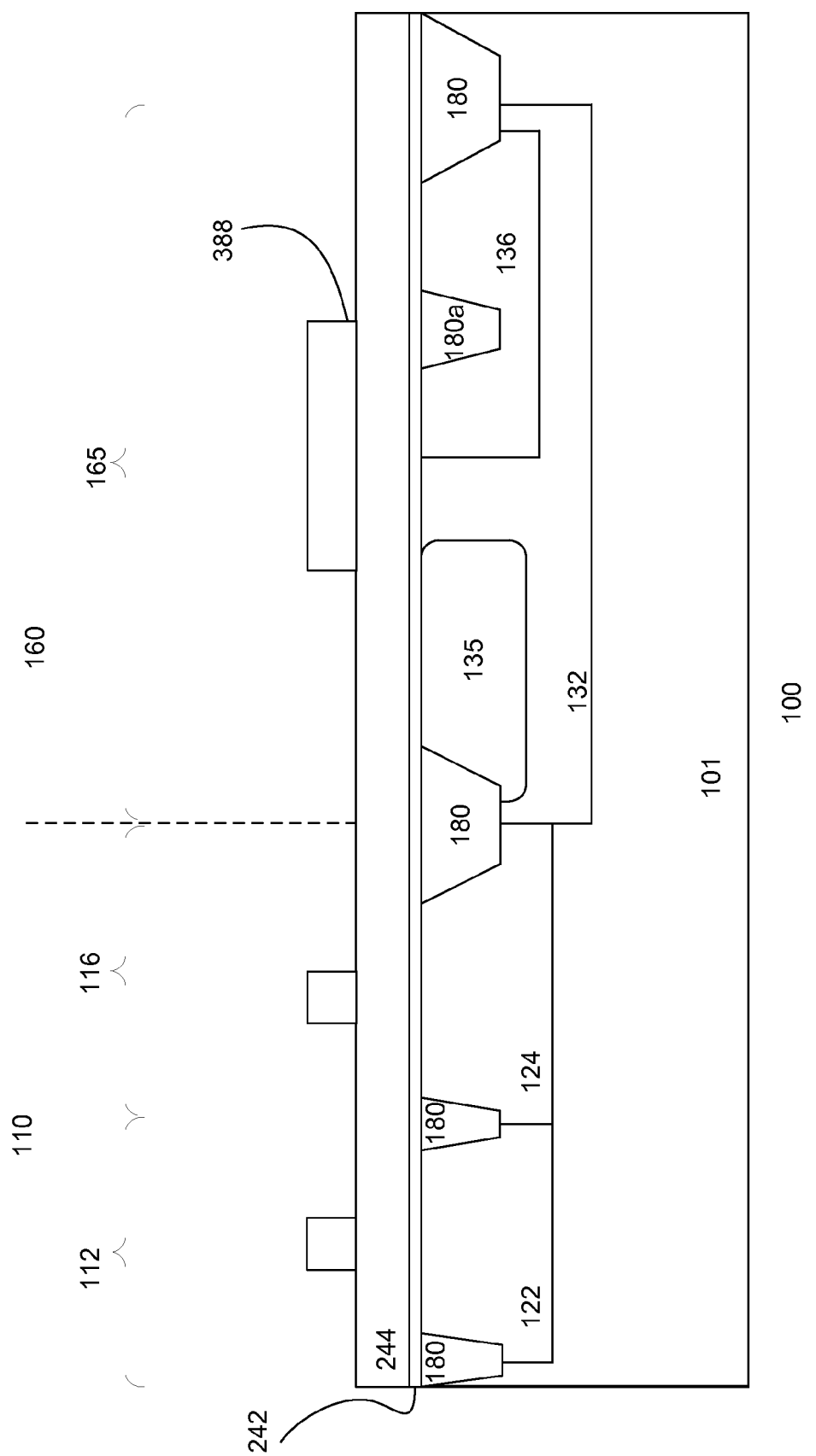

As shown in FIG. 3d, another soft mask layer 287 is deposited on the substrate, covering the hard mask layer and exposed gate electrode layer. The soft mask is patterned by lithography. The soft mask protects portions of the hard mask layer 388 corresponding to the transistor gates. A new ARC layer can be provided between the soft mask 287 and the hard mask 388. In FIG. 3e, exposed portions of the hard mask are removed, exposing portions of the gate electrode layer. Patterning of the hard mask layer can be achieved by, for example, RIE. The patterned hard mask serves as a gate mask. The soft mask, as shown in FIG. 3f, is removed after patterning the hard mask.

Figure 3G:
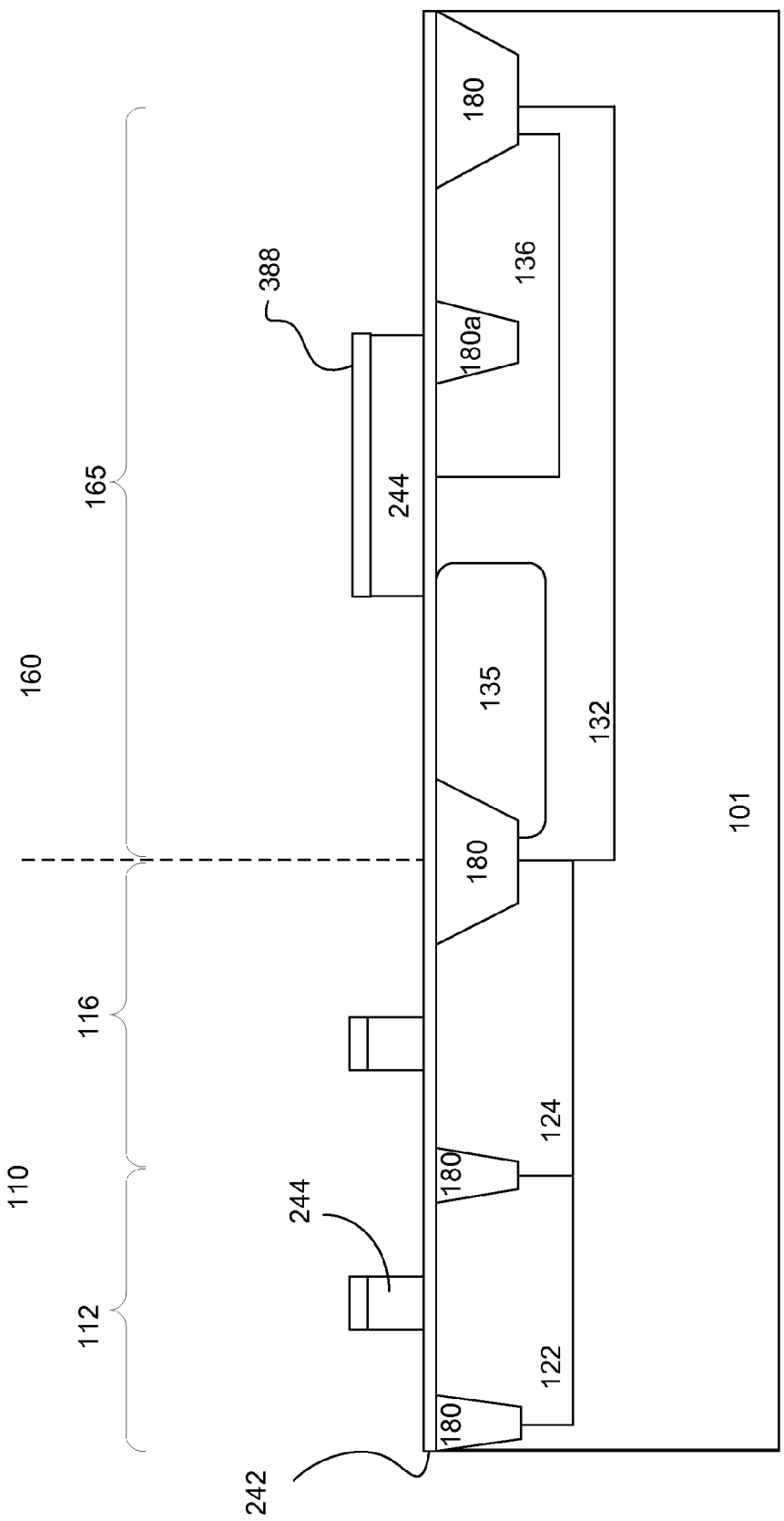

Referring to FIG. 3g, the gate electrode layer 244 is patterned to form gates in the LV and HV region by, for example etch. Patterning of the gate electrode layer can be achieved using, for example, RIE. The patterning of the gate electrode layer also erodes the hard mask, reducing its thickness. The hard mask 388 can be removed by, for example, a clean step after etching the gate electrode layer. The process continues as previously described to complete the device.

Figure 4A:
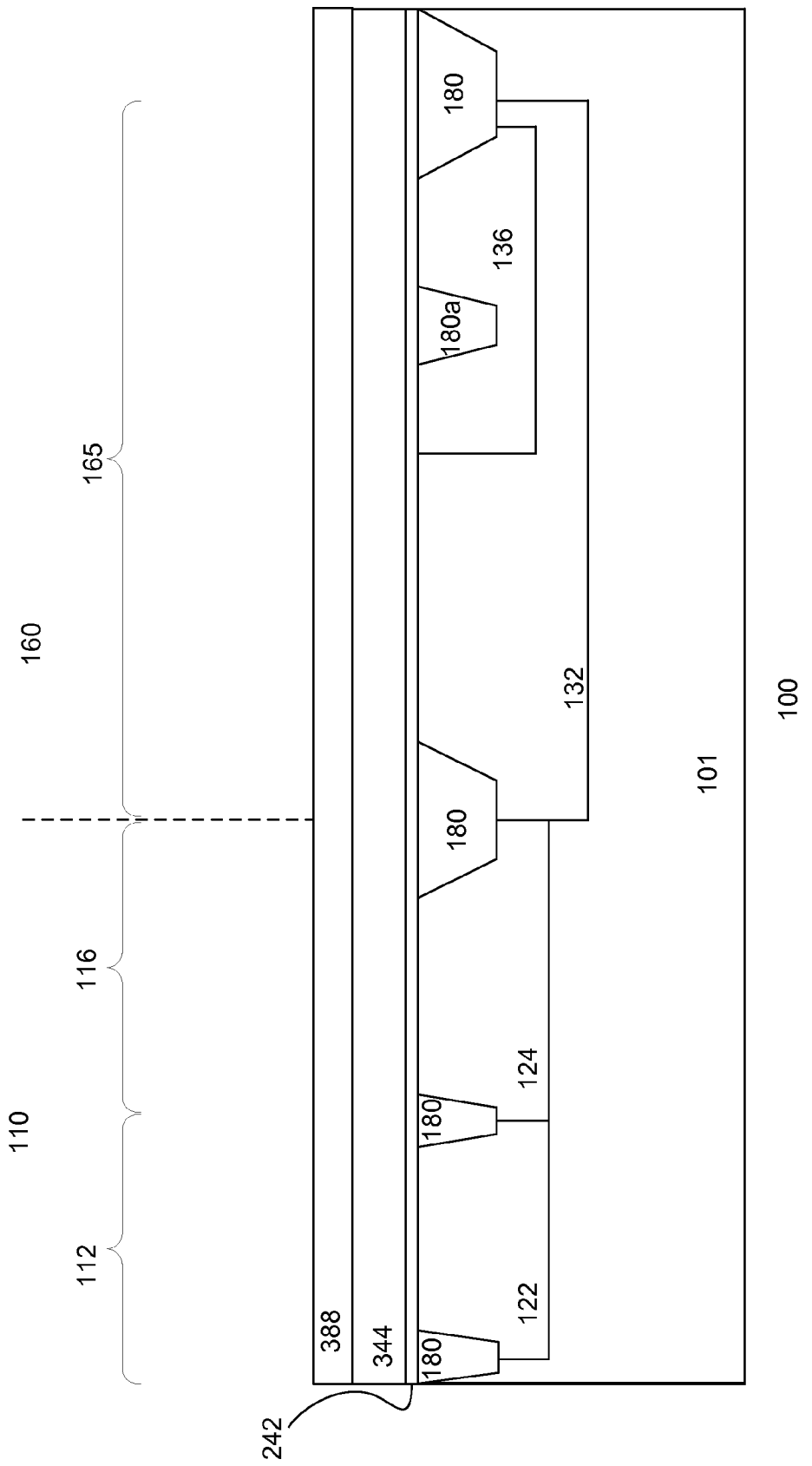
FIGS. 4a-g show another embodiment of a process for forming a device.

Another embodiment of a process for forming a device 100 is shown in FIGS. 4a-g. Referring to FIG. 4a, a partially processed device is shown. The partially processed device is similar to that shown in FIG. 3a.

Figure 4B:
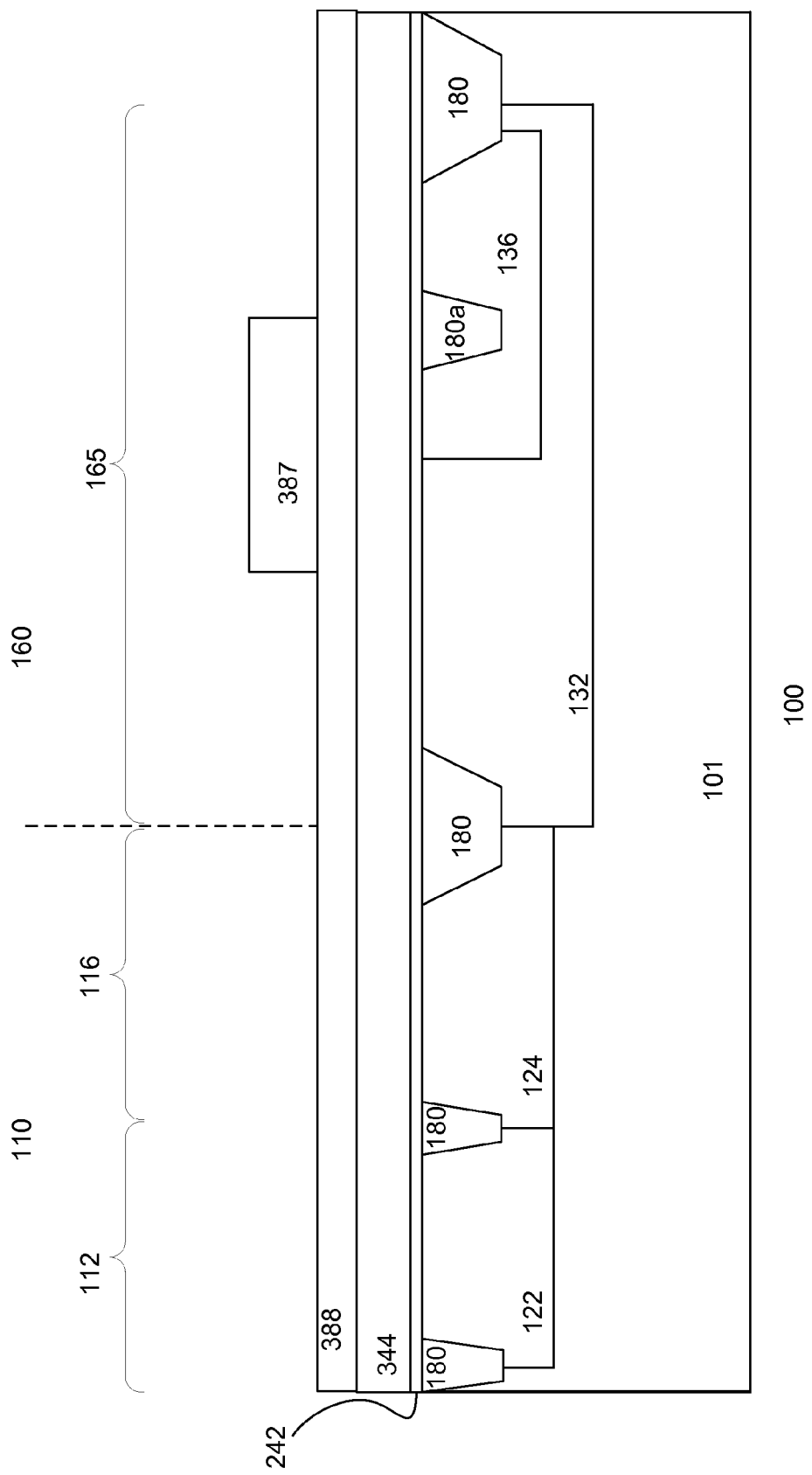

Referring to FIG. 4b, a soft mask layer 387, such as a photoresist layer, is formed on the hard mask 388. An ARC layer can be provided between the soft mask and the hard mask. The soft mask layer is patterned to expose portions of the hard mask 388. The remaining portion of the soft mask corresponds to the HV gate in the HV region 160. Patterning of the soft mask layer can be achieved by photolithographic techniques. In one embodiment, the patterned soft mask layer also exposes the hard mask in the LV region 110.

Figure 4C:
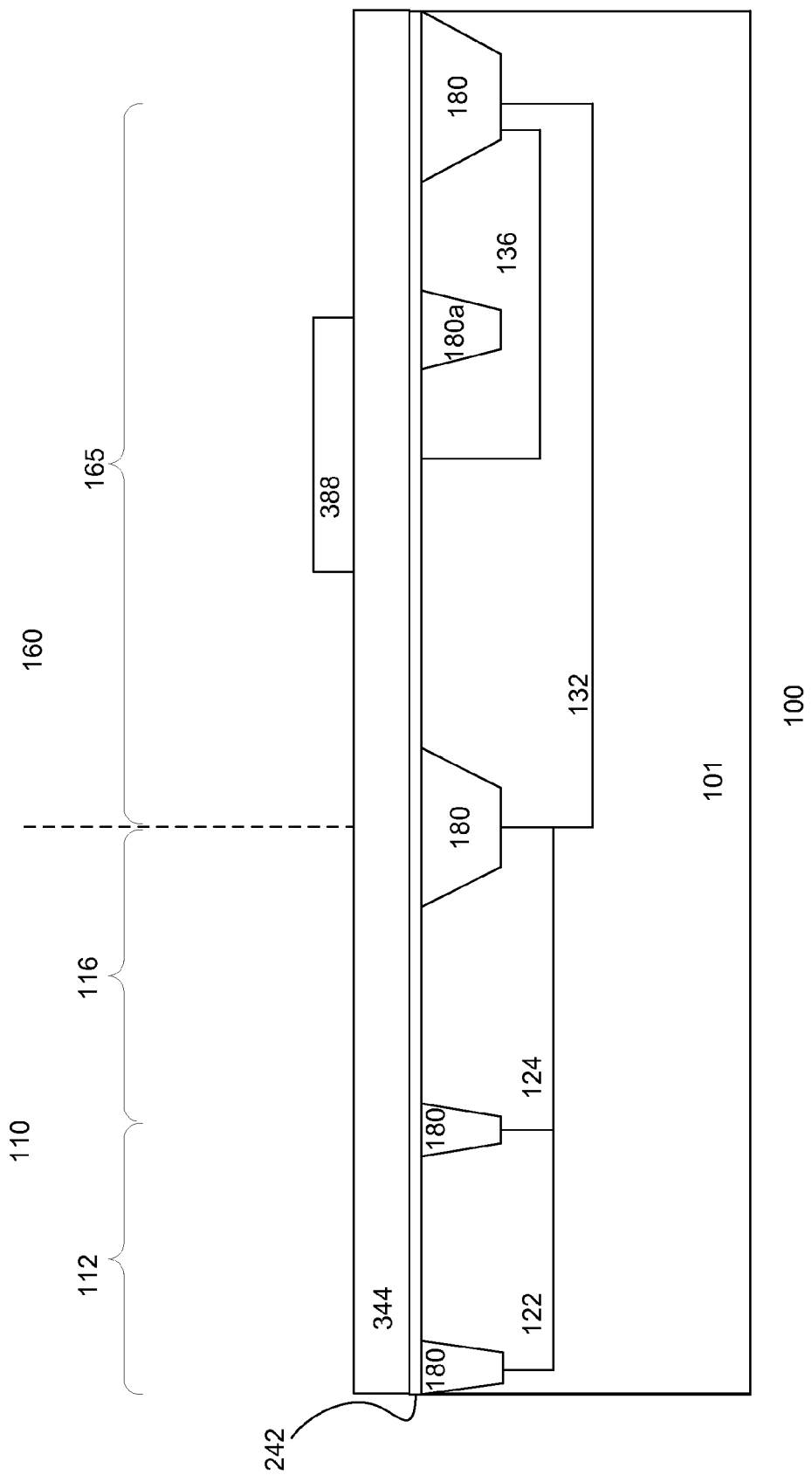

As shown in FIG. 4c, the pattern of the soft mask is transferred to the hard mask by, for example, RIE. The RIE removes exposed portions of the hard mask to expose portions of the gate electrode layer 344 in the HV region which are to be removed. In one embodiment, the removal of the hard mask also exposes the gate electrode layer in the LV region. After patterning of the hard mask, the soft mask layer is removed.

Figure 4D:
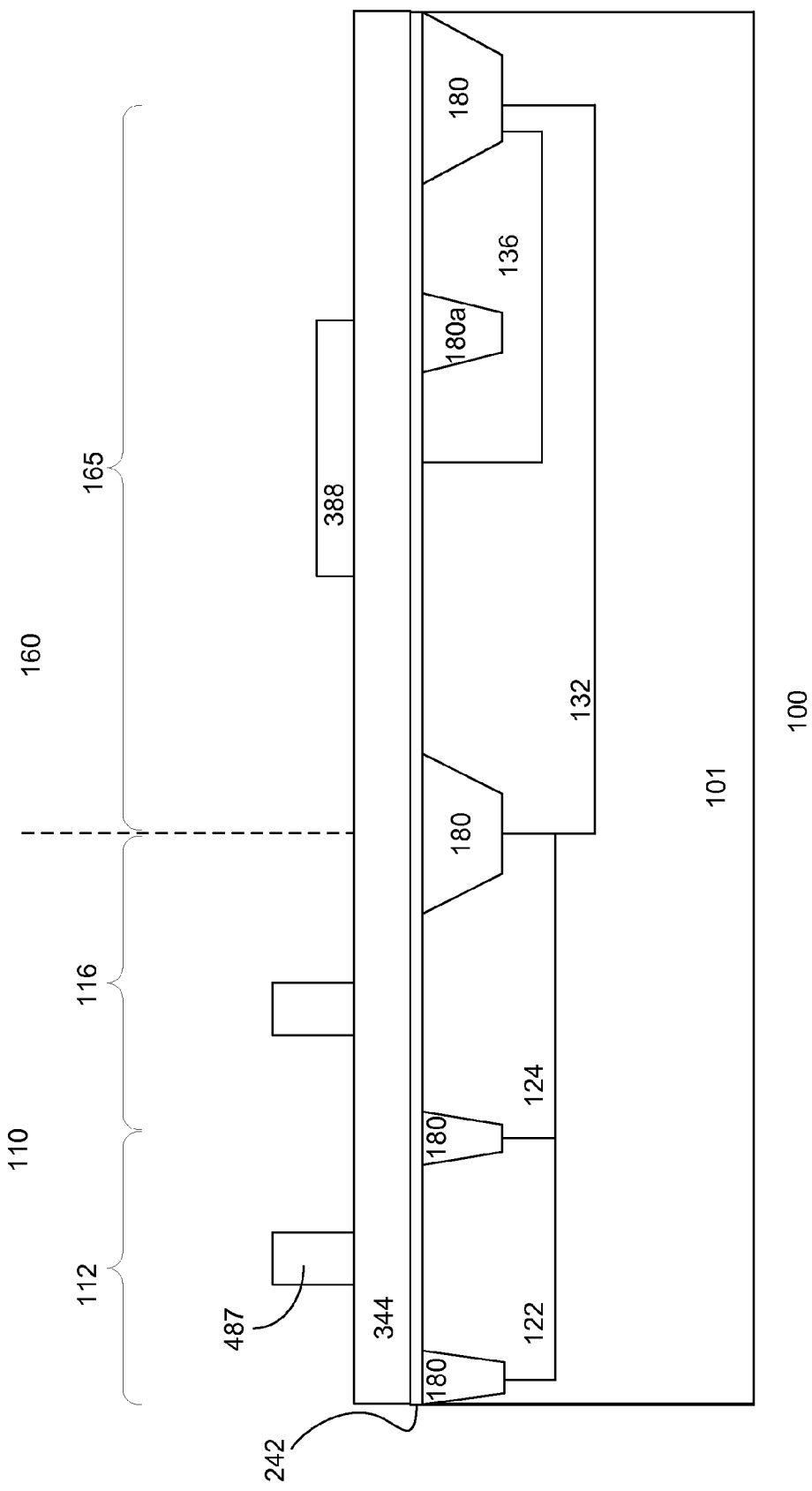

In FIG. 4d, another soft mask layer 487, such as a photoresist layer, is formed over the substrate. An ARC layer may be provided beneath the soft mask layer. The soft mask layer can be patterned by photolithographic techniques to expose portions of the gate electrode layer 344 in the LV region which are to be removed, protecting portions corresponding to gates of the LV devices. For example, the patterned soft mask serves as a gate mask for the LV region. The soft mask layer is removed from the HV region.

Figure 4E:
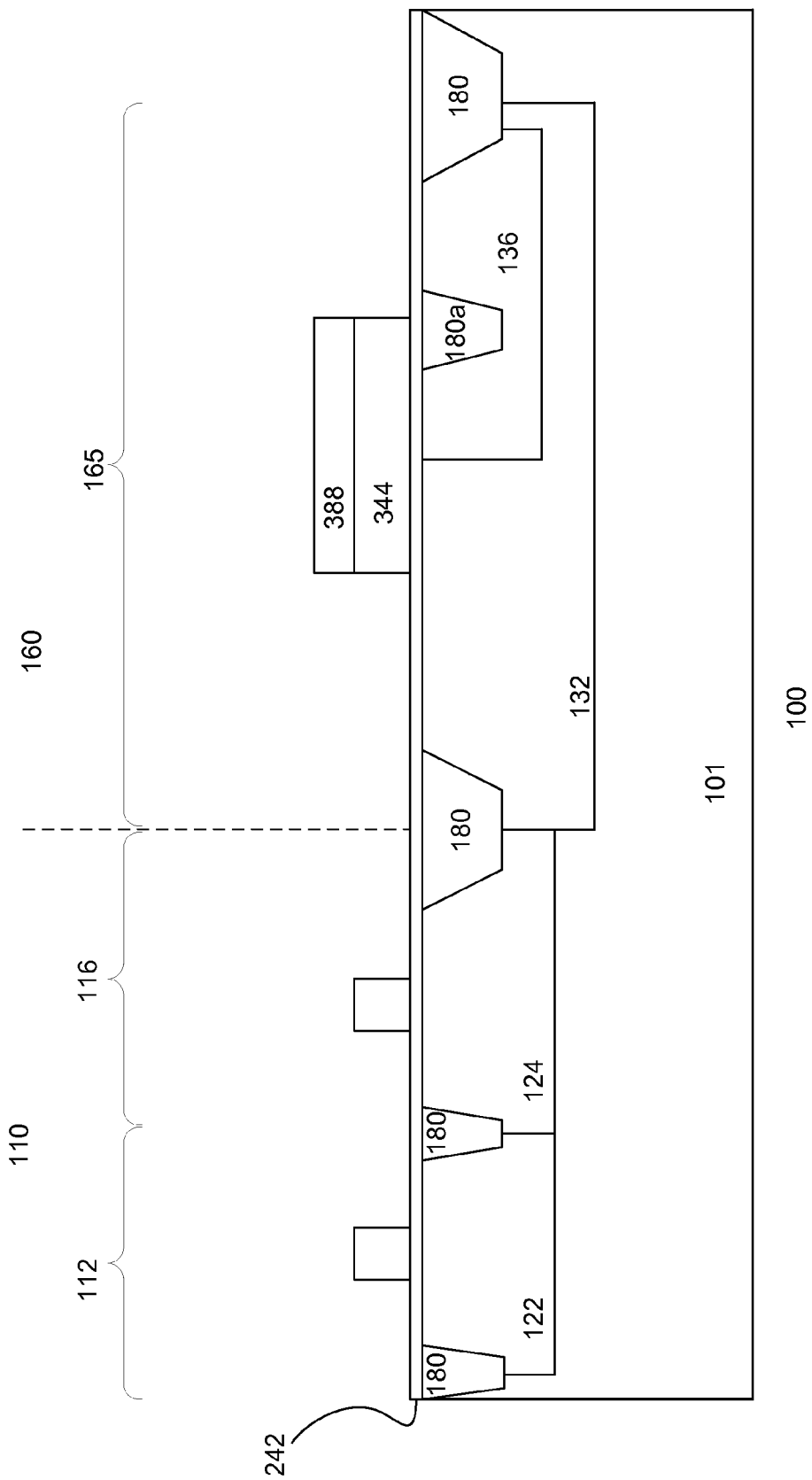

The gate electrode layer is patterned in FIG. 4e. In one embodiment, the gate electrode layer in the LV region is patterned using the soft mask while the hard mask is used in the HV region. The use of the soft mask advantageously facilitates forming gates of critical dimensions in the LV region.

Figure 4F:
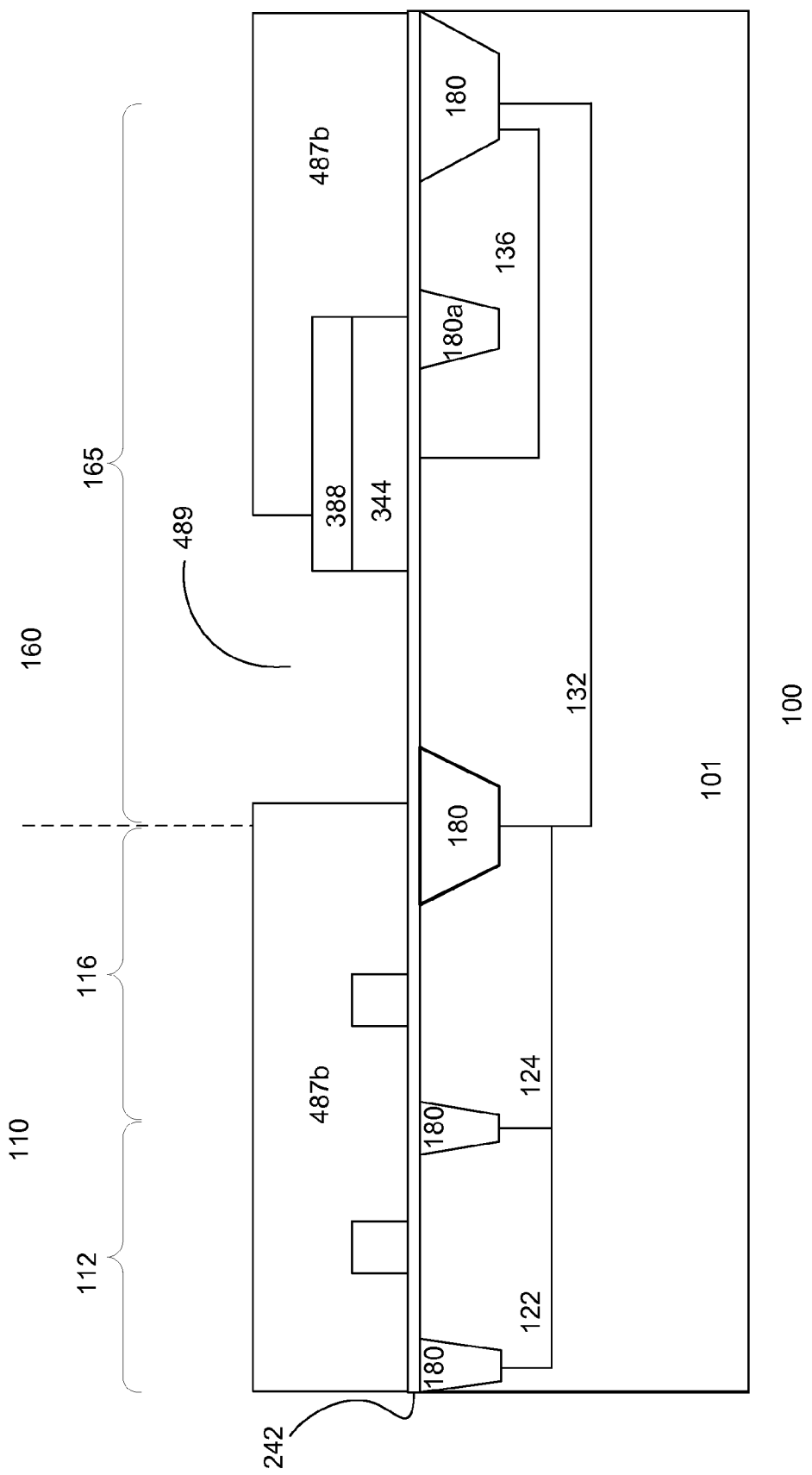

Referring to FIG. 4f, another soft mask layer 487b, such as photoresist, is formed over the substrate. An ARC layer may be provided beneath the soft mask. The soft mask layer can be patterned by photolithographic techniques to form an opening 489. The patterned soft mask layer serves as a channel implant mask.

Figure 4G:
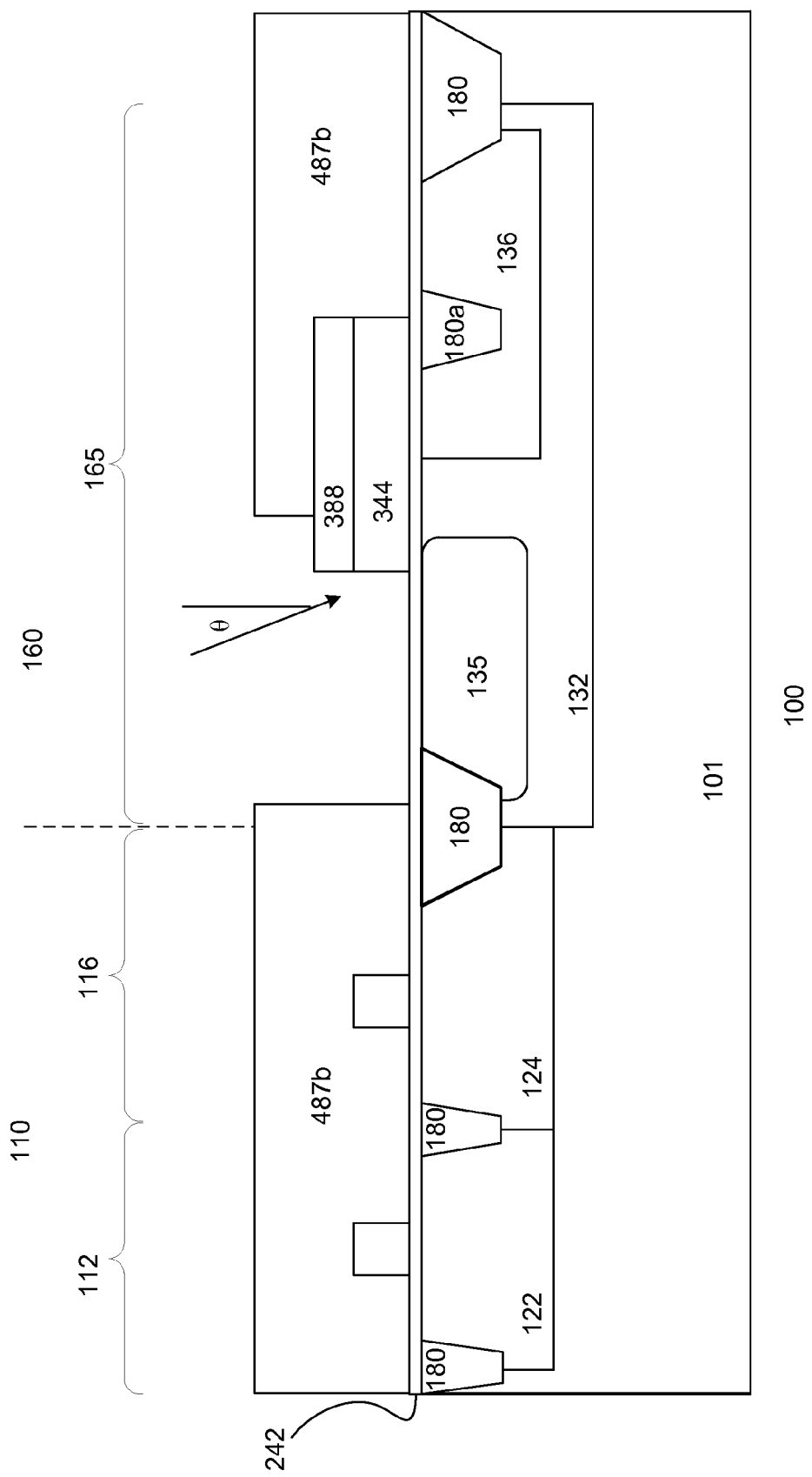

As shown in FIG. 4g, the substrate is implanted with dopants to form a channel doped well 135. In one embodiment, dopants of the opposite type as the type of the HV active region are implanted. For example, p-type dopants are implanted into the p-type deep well of a n-type HV active region.

In one embodiment, the dopants are implanted at an angle to form a channel from the gate edge to the edge of the channel well. The implant angle $\theta$ can be in a range of about 1 to 45°. Other implant angles may also be useful. The implant conditions can be varied depending on application requirements. For example, the angle, dose and energy can be selected to achieve the desired effective channel length.

In one embodiment, the channel well is formed by multiple implants. For example, the channel well can be formed by at least two tilt and rotate implants. In one embodiment, the implant comprises a quad implant. A quad implant comprises 4 tilted angled implants, each rotated by a rotation angle. For example, a p-type channel well can be formed with a quad implant at a tilt angle of about 30° with rotation angle of about 45° with a boron dose of about $2E13$ cm$^{-2}$ at an energy level of about 130 KeV. Other tilt angles, rotation angles, doses and energy levels are also useful. For example, a quad implant can comprise a tilt angle of about 45° with rotation angle of about 45° with a boron dose of about $2E13$ cm$^{-2}$ at an energy level of about 150 KeV.

In one embodiment, the implant mask and hard mask are removed after forming the channel well. For example, the implant mask is first removed followed by the removal of the hard mask. In some embodiments, the hard mask is remained. The process continues as previously described to complete the device after the formation of the gates.

Figure 5A:
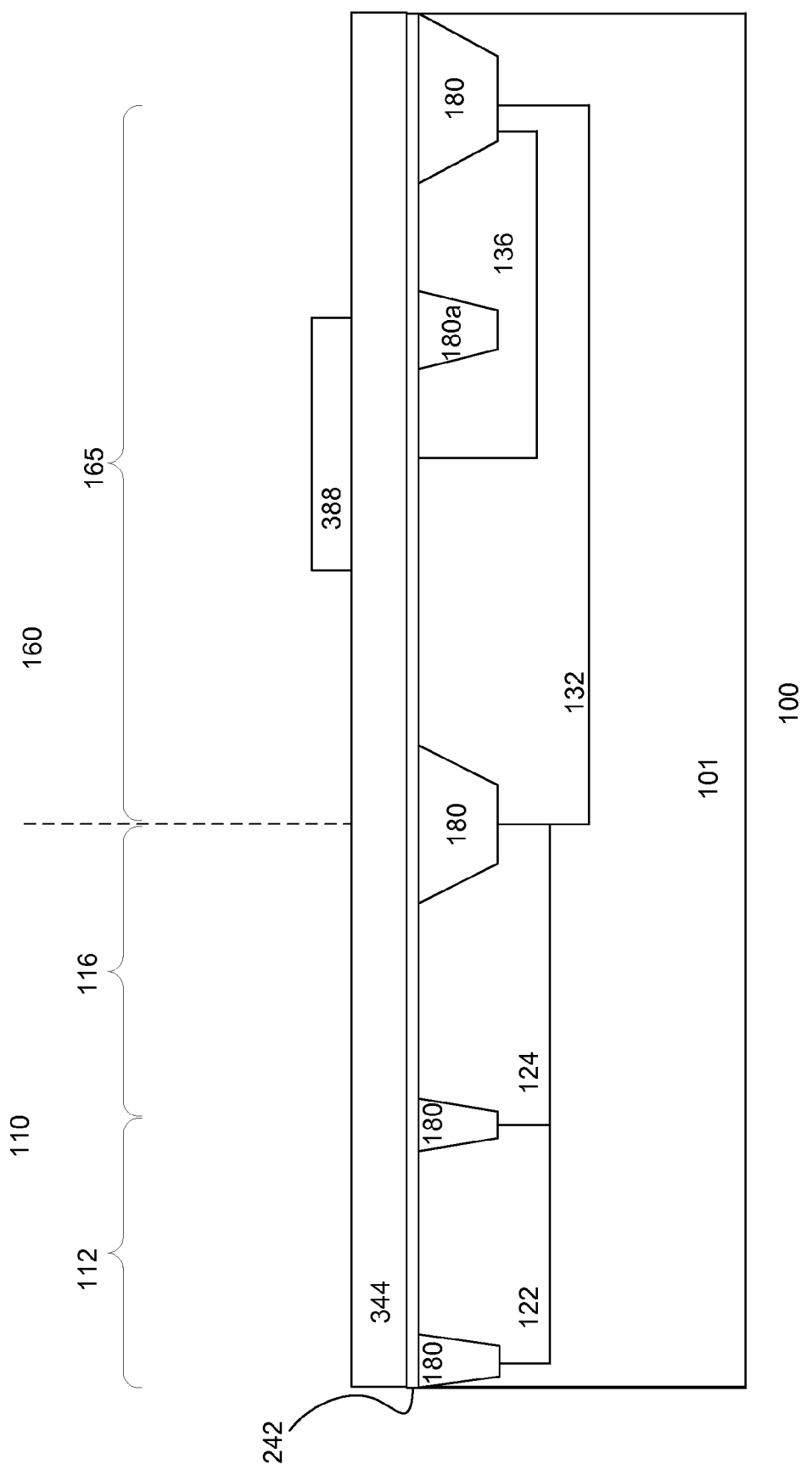

An alternative embodiment of a process for forming a device 100 is shown in FIGS. 5a-g. Referring to FIG. 5a, a partially processed device is shown. The partially processed device is similar to that shown in FIG. 4c.

Figure 5B:
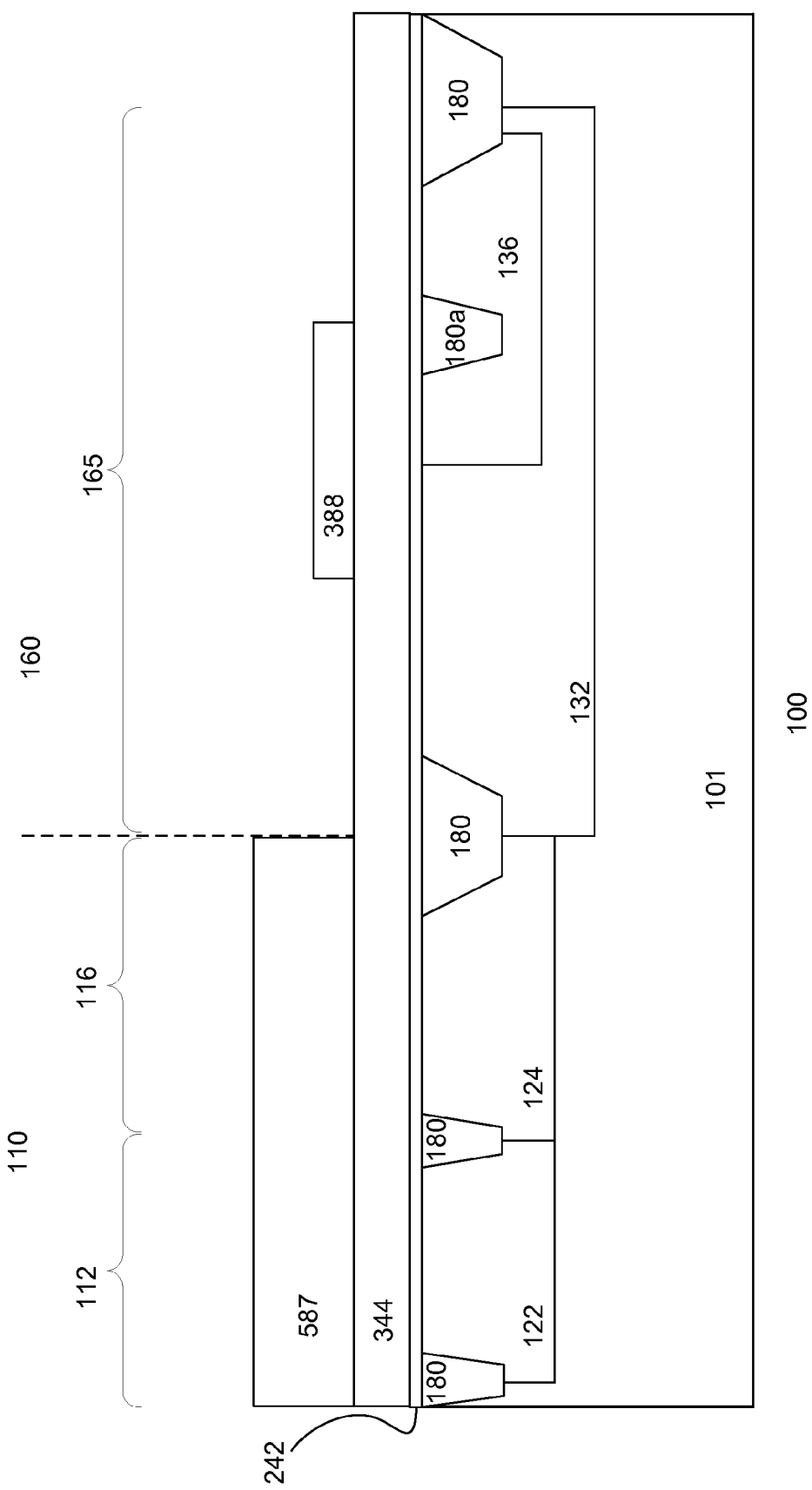
Figure 5C:
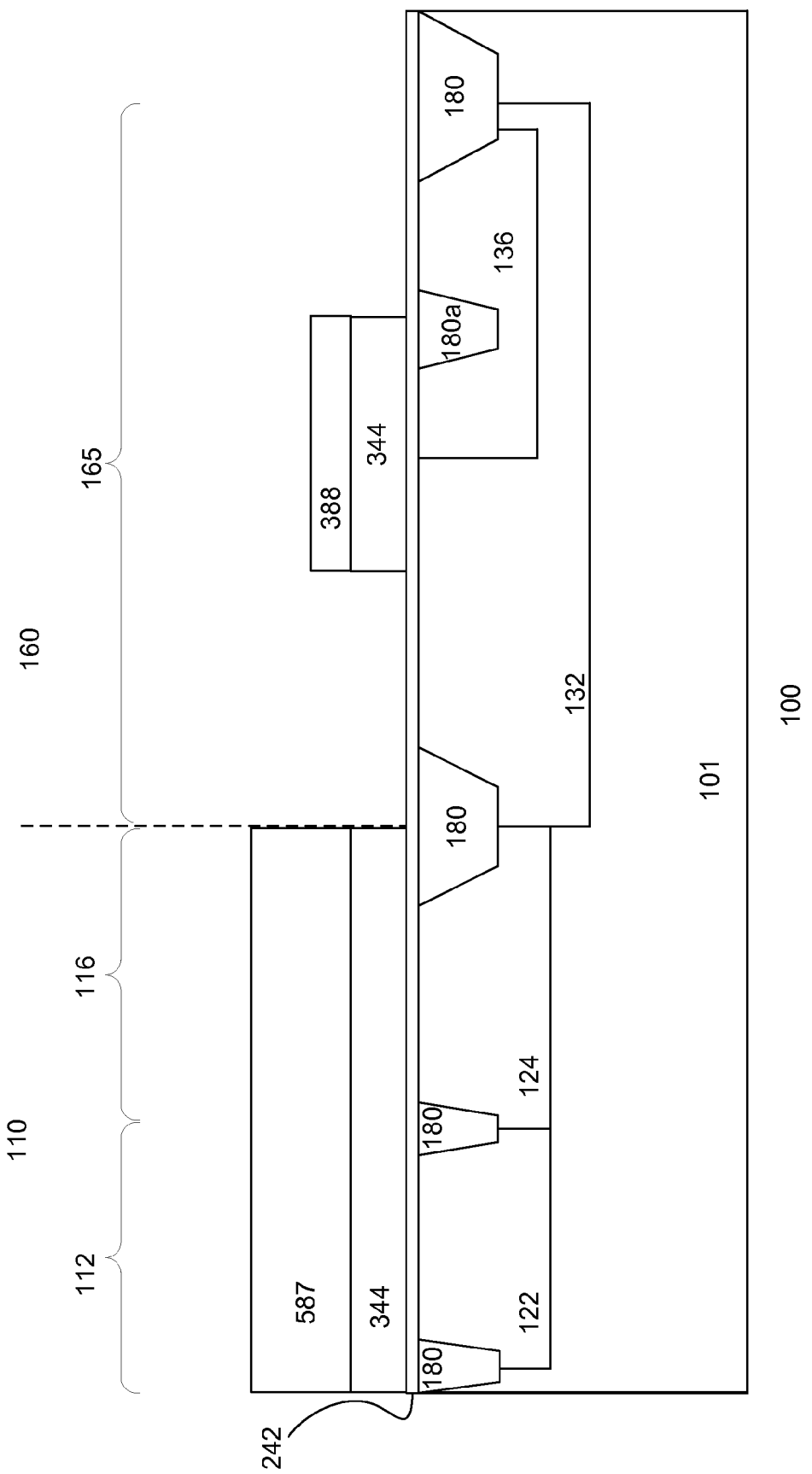

As shown in FIG. 5b, a soft mask layer 587, such as a photoresist layer, is formed over the substrate. An ARC layer may be provided beneath the gate soft mask layer. The soft mask layer can be patterned by photolithographic techniques to expose the HV region, protecting the LV devices from being processed. As illustrated by FIG. 5c, the gate electrode in the HV region is patterned by, for example, RIE, to form the gate using the hard mask as the gate mask. After patterning of the gate electrode in the HV region, the soft mask layer is removed.

Figure 5D:
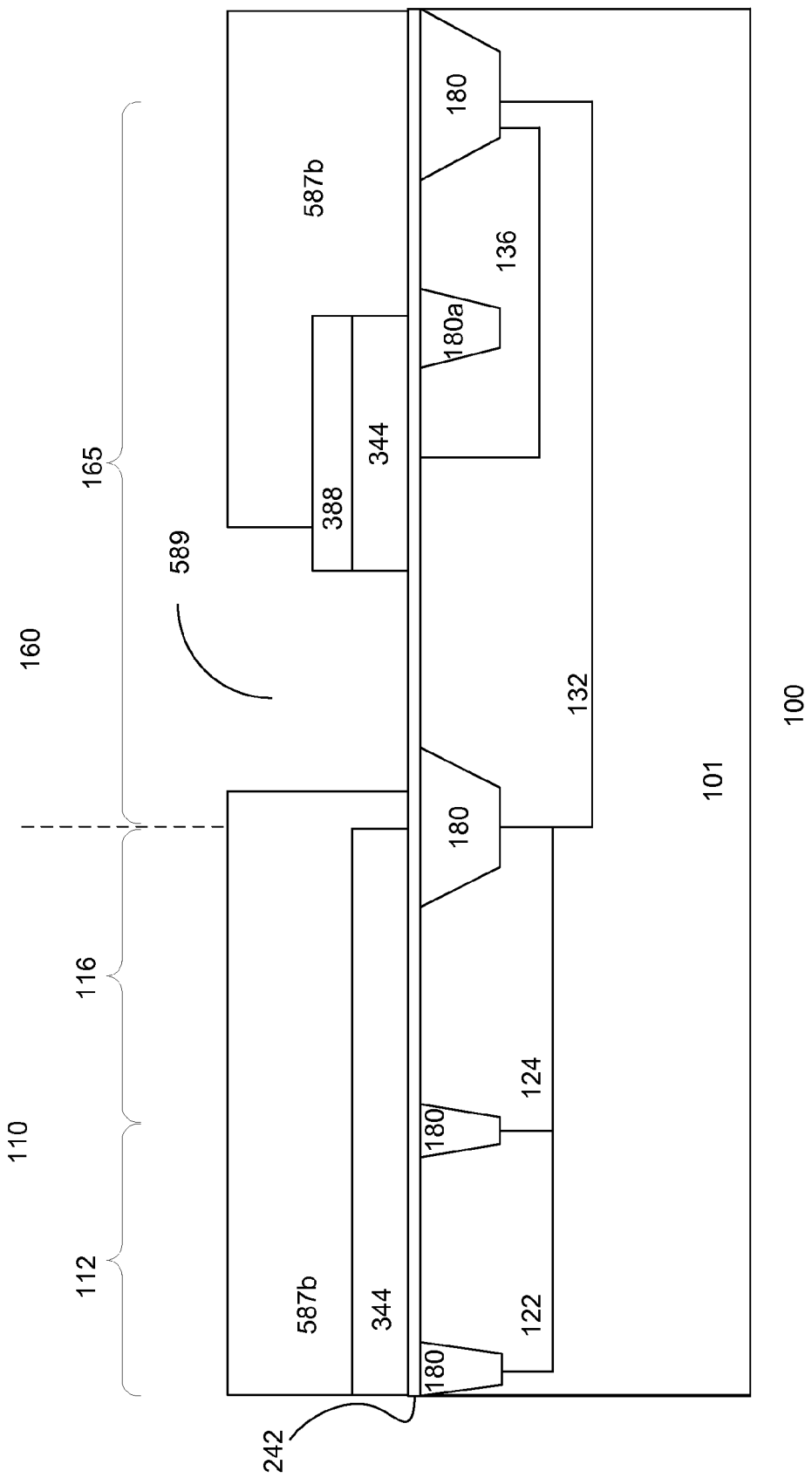

Referring to FIG. 5d, another soft mask layer 587b, such as photoresist, is formed over the substrate. An ARC may be provided beneath the soft mask layer. The soft mask layer can be patterned by photolithographic techniques to form an opening 589. The patterned soft mask layer serves as a channel implant mask.

As shown in FIG. 5e, the substrate is implanted with dopants to form a channel doped well 135. In one embodiment, dopants of the opposite type as the type of the HV active region are implanted. For example, p-type dopants are implanted into the p-type deep well of a n-type HV active region.

In one embodiment, the dopants are implanted at an angle to form a channel from the gate edge to the edge of the channel well. The implant angle $\theta$ can be in a range of about 1 to 45°. Other implant angles may also be useful. The implant conditions can be varied depending on application requirements. For example, the angle, dose and energy can be selected to achieve the desired effective channel length.

In one embodiment, the channel well is formed by multiple implants. For example, the channel well can be formed by at least two tilt and rotate implants. In one embodiment, the implant comprises a quad implant. A quad implant comprises 4 tilted angled implants, each rotated by a rotation angle. For example, a p-type channel well can be formed with a quad implant at a tilt angle of about 30° with rotation angle of about 45° with a boron dose of about $2E13$ cm$^{-2}$ at an energy level of about 130 KeV. Other tilt angles, rotation angles, doses and energy levels are also useful. For example, a quad implant can comprise a tilt angle of about 45° with rotation angle of about 45° with a boron dose of about $2E13$ cm$^{-2}$ at an energy level of about 150 KeV.

Figure 5F:
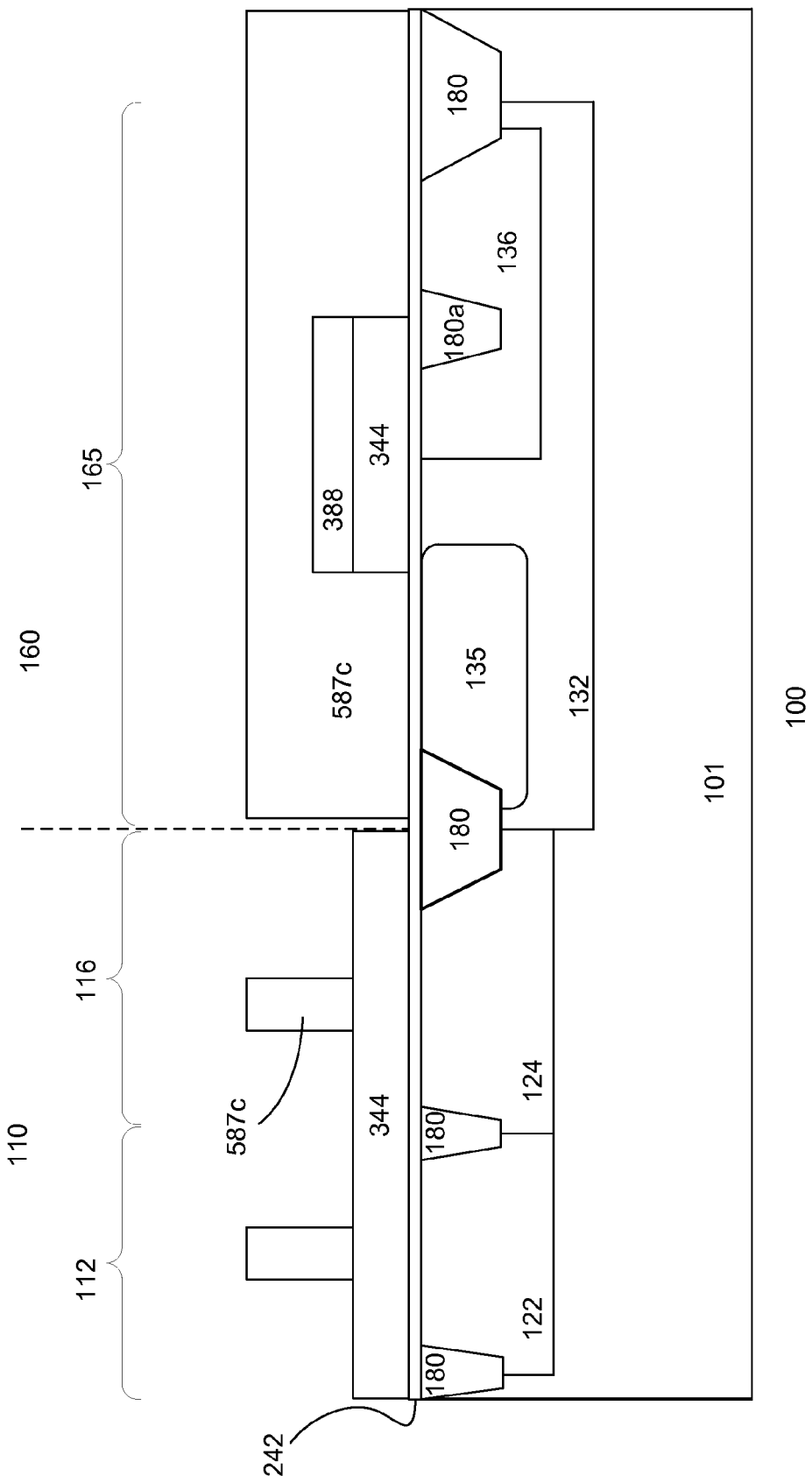
Figure 5G:
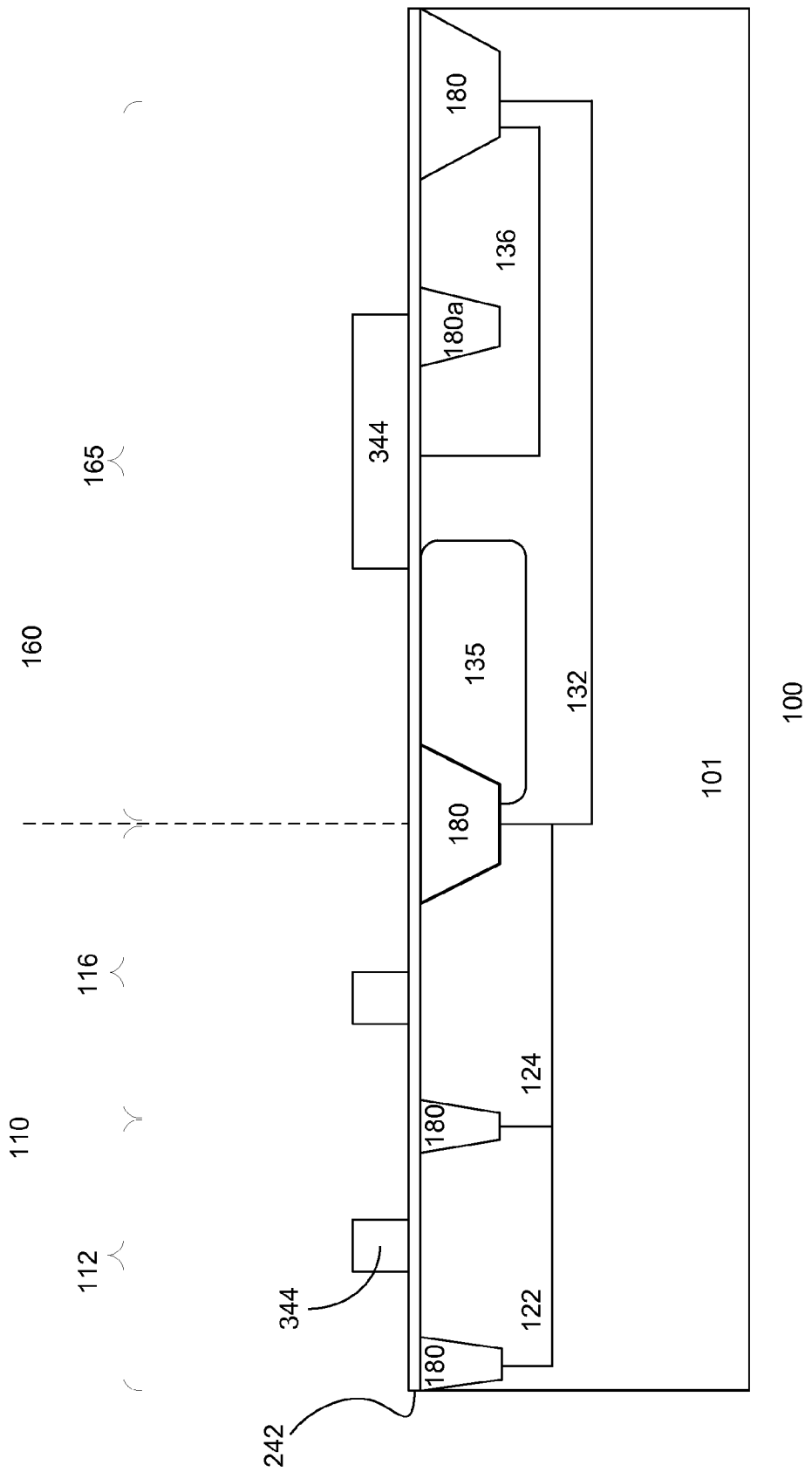

Referring to FIG. 5f, another layer of soft mask layer 587c, such as photoresist, is formed over the substrate. An ARC layer may be provided beneath the soft mask layer. The soft mask layer is patterned by photolithographic techniques to expose portions of the gate electrode layer 344 in the LV region to be removed. Additionally, the soft mask layer remains in the HV region to protect it from being processed. The exposed portions of the gate electrode layer 344 are removed to form the gates of the LV device, as illustrated in FIG. 5g.

Similar to the embodiment of FIGS. 4a-g, the LV gates are patterned using a soft mask while a hard mask is used to pattern the HV gate. After forming the LV gates, the soft mask is removed followed by removal of the hard mask over the HV gate. In some embodiments, the hard mask can remain. The process continues to complete the device as described previously.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate prepared with an active device region, wherein the active device region includes gate stack layers of a gate stack comprising at least a gate electrode layer over a gate dielectric layer;
   providing a first mask on the substrate corresponding to the gate;
   patterning the substrate to at least remove portions of a top gate stack layer unprotected by the first mask;
   providing a second mask on the substrate with an opening exposing a portion of the first mask and the top gate stack layer; and
   implanting ions through the opening and gate stack layers into the substrate to form a channel well.

2. The method of claim 1 wherein the top gate stack layer comprises the gate electrode layer of the gate stack.

3. The method of claim 2 wherein the gate electrode layer comprises silicon, including amorphous or polysilicon.

4. The method of claim 2 wherein the first mask comprises a hard mask.

5. The method of claim 4 wherein a first edge of the gate corresponds to a channel edge of the gate of the device and a second edge of the gate corresponds to the drain edge of the gate of the device.

6. The method of claim 1 wherein the first edge of the gate corresponds to a channel edge of the gate of the device and the second edge of the gate corresponds to the drain edge of the gate of the device.

7. The method of claim 1 wherein patterning the substrate leaves the gate dielectric layer remaining on the substrate.

8. The method of claim 1 wherein patterning the gate stack layers leaves the gate dielectric layer remaining on the substrate.

9. The method of claim 1 wherein implanting ions comprises a tilt angle implant.

10. The method of claim 1 wherein a tilt angle of the implant is about 1-45°.

11. The method of claim 1 wherein implanting ions comprises multiple tilt angle implants which are rotated about a plane of the substrate.

12. The method of claim 11 wherein a tilt angle of the implant is about 1-45°.

13. The method of claim 1 wherein implanting ions comprises a quad tilt angle implant which is rotated about a plane of the substrate.

14. The method of claim 1 wherein the second mask comprises photoresist.

15. The method of claim 14 wherein the first mask comprises a hard mask.

16. The method of claim 15 wherein a first edge of the gate corresponds to a channel edge of the gate of the device and a second edge of the gate corresponds to the drain edge of the gate of the device.

17. A method of forming a device comprising:
    providing a substrate prepared with an active device region which includes a doped drift well in a first portion of the active device region and gate stack layers of a gate stack comprising at least a gate electrode layer over a gate dielectric layer on the surface of the substrate;
    providing a first mask on the substrate corresponding to the gate;
    patterning the substrate to at least remove portions of a top gate stack layer unprotected by the first mask;
    providing a second mask on the substrate with an opening exposing a portion of the first mask and the top gate stack layer; and
    implanting ions through the opening and gate stack layers into the substrate to form a channel well.

18. The method of claim 17 wherein the substrate comprises:
    a drift isolation region in the doped drift well; and
    a doped deep well in the substrate of the active device region encompassing the doped drift well.

* * * * *